US009146267B2

(12) United States Patent
Lee et al.

(10) Patent No.: US 9,146,267 B2
(45) Date of Patent: Sep. 29, 2015

(54) SYSTEMS AND METHODS FOR ARC FLASH HAZARD ASSESSMENT

(71) Applicant: The Institute of Electrical and Electronics Engineers, Incorporated, Piscataway, NJ (US)

(72) Inventors: Wei-Jen Lee, Colleyville, TX (US); Tammy L. Gammon, Jasper, GA (US); Zhenyuan Zhang, Arlington, TX (US)

(73) Assignee: The Institute of Electrical and Electronics Engineers, Incorporated, Piscataway, NJ (US)

( * ) Notice: Subject to any disclaimer, the term of this patent is extended or adjusted under 35 U.S.C. 154(b) by 289 days.

(21) Appl. No.: 13/793,488

(22) Filed: Mar. 11, 2013

(65) Prior Publication Data

US 2014/0257723 A1 Sep. 11, 2014

(51) Int. Cl.
*G01R 31/00* (2006.01)
*G01R 31/02* (2006.01)

(52) U.S. Cl.
CPC ............ *G01R 31/001* (2013.01); *G01R 31/025* (2013.01)

(58) Field of Classification Search
None
See application file for complete search history.

(56) References Cited

U.S. PATENT DOCUMENTS

2008/0036472 A1* 2/2008 Collins et al. ................. 324/649
2011/0275267 A1* 11/2011 Smith et al. ................... 442/301

OTHER PUBLICATIONS

IEEE Guide for Performing Arc-Flash Hazard Calculations, IEEE Std 1584-2002, Sep. 2002 (IEEE Std 1584-2002).
Doughty, R.L. et al. "Predicting incident energy to better manage the electric arc hazard on 600 v power distribution systems," IEEE Transactions on Industry 4. Applications, 36(1): 257-269, Jan./Feb. 2000 (Doughty IEEE IA36-1 2000).
Doughty, R.L. et al. "Testing update on protective clothing & equipment for electric arc exposure," IEEE Industry Applications Society Magazine, 5(1): 37-49, Jan./Feb. 1999 (Doughty IEEE IA5-1 1999).
Doughty, R.L. et al. "The use of low-voltage current-limiting fuses to reduce arc-flash energy," IEEE Transactions on Industry Applications, 36(6): 1741-1749, Nov./Dec. 2000 (Doughty IEEE IA36-6 2000).
Gammon, T. et al. "Incident energy factors and simple 480-V incident energy equations," IEEE Industry Applications Magazine, 11(1): 23-31, Jan./Feb. 2005 (Gammon IEEE 2005 IA11-1 2005).
Lee, R.H. "The other electrical hazard: electric arc blast burns," IEEE Transactions on Industry Applications, 18(3): 246-251, May/Jun. 1982 (Lee IEEE IA18-3).
Lee, R.H., "Pressures developed by arcs," IEEE Transactions on Industry Applications, vol. Ia-23, No. 4, pp. 760-764, Jul./Aug. 1987 (Lee IEEE IA23-4 1987).

(Continued)

*Primary Examiner* — Aditya Bhat
(74) *Attorney, Agent, or Firm* — Dorsey & Whitney LLP

(57) ABSTRACT

An arc flash hazard assessment method includes storing electrical equipment data in memory, defining an arc flash model function based on the data, and estimating the model function based on a weighted average of interpolated and extrapolated values. The electrical equipment data may include an operating voltage, a fault current, and a clearing time. The model function is defined for at least three reference voltages $V_1$, $V_2$ and $V_3$, with the interpolated value at operating voltage V, between voltages $V_1$ and $V_2$, and the extrapolated value from reference voltages $V_2$ and $V_3$. At the arc flash protection boundary, the estimated model function has a predefined incident energy value of 1.2 cal/cm$^2$ (or about 5.02 J/cm$^2$), or less.

43 Claims, 14 Drawing Sheets

(56) References Cited

OTHER PUBLICATIONS

Neal et al. "Protective clothing guidelines for electric arc exposure," IEEE Transactions on Industry Applications, 33 (4): 1041-1054, Jul./Aug. 1997 (Neal IEEE IA33-4).
NFPA 70E, "Standard for Electrical Safety in the Workplace," 2012 Edition, National Fire Protection Association, Quincy, MA, 2011 (NFPA Std 70E).
Wilkins, R. et al. "Calculating hazards," IEEE Industry Applications Magazine, 11(3): 40-48, May/Jun. 2005 (Wilkins IEEE IA11-3 2005).
"NFPA / IEEE Research and Testing Planning Committee Final Report" IEEE/NFPA Confidential RTPC Report. Jul. 28, 2005.
*DDR Holdings, LLC* v. *Hotels.com, L.P.,* 773 F.3d 1245, slip op. (Fed. Cir., Dec. 5, 2014).
*Trading Technologies Int'l , Inc.* v. *CQG, Inc.,* 05-cv-4811, Memorandum Opinion and Order (N.D. Ill., Feb. 24, 2015).
*Messaging Gateway Solutions, LLC* v. *AmDocs, Inc.,* CV 14-732-RGA, Memorandum Opinion (D. Del., Apr. 15, 2015).

* cited by examiner

SYSTEMS AND METHODS FOR ARC FLASH HAZARD ASSESSMENT

BACKGROUND

Every year, thousands of workers are subject to burns and other injuries due to arc flash events. Arc flashes occur when an electric current passes through an air gap between electrified conductors, or from conductor to ground, when the insulation or isolation is not sufficient to withstand the applied voltage. While the arc flash event itself can occur almost immediately, or within a few milliseconds, the results can be lasting, ranging from superficial burns to debilitating injury, or even death.

Due to the significant threats posed by arc flash events, professional and trade associations including the Institute for Electrical and Electronics Engineers (IEEE) and the National Fire Protection Association (NFPA) have conducted substantial research and testing to quantify and improve related electrical safety standards. In particular, these efforts are directed to predicting the hazards associated with arc faults and the accompanying arc blasts, in order to provide practical workplace safeguards.

The most effective way to protect workers from arc flash hazards is to de-energize the circuit before attempting to work on or near the exposed conductors. There are some tasks, however, for which work must be performed on energized components, including troubleshooting, testing, and certain types of repair.

When work is necessary on an electrified system, an electrical hazard analysis must be conducted. In general, this includes not only a shock hazard analysis to determine the voltages to which personnel may be exposed, but also an arc flash hazard calculation. The arc flash analysis determines the arc flash protection boundary (or arc flash boundary), from which non-essential workers and other personnel should be excluded. The arc flash analysis can also be used to classify the arc flash risk and determine what personal protective equipment (PPE) may be required, for those personnel who must work inside this boundary.

To address these issues, arc flash hazard analysis is utilized to model arcing currents and incident energy exposure levels to which workers may be exposed in a potential arc flash event. The arc flash protection boundary is also calculated, so that appropriate protective measures can be taken.

Arc flash analysis, however, is a highly complex task, requiring an extensive understanding of electronics, electromagnetic effects, plasma flow properties and magnetohydrodynamics, at extremely high current, energy, and plasma densities. There is a continuous need to better quantify arc flash hazards, in order to protect workers and promote safer, more effective and efficient workplace practices for electrical equipment installation, maintenance and repair.

SUMMARY

This application is directed to arc flash hazard assessment. Electrical equipment data (or field data) are stored in memory, and used to define an arc flash model function, for example an incident energy function, at three reference voltages $V_1$, $V_2$, and $V_3$. The data may include an operating voltage, a fault current, and a clearing time. The model function or incident energy can be estimated at the operating voltage based on a weighted average of interpolated and extrapolated values. The arc flash protection boundary is defined where the model function provides an estimated incident energy value of 1.2 cal/cm$^2$ (or about 5.02 J/cm$^2$), or less.

Computer-based systems and methods for implementing the arc flash hazard assessment are contemplated, as well as non-volatile data storage media having programs that are executable to perform such methods, when running on similar systems. The estimated incident energy and arc current can also be provided, for example to determine potential exposure at a user-defined working distance from the potential arc source, or to determine the clearing time.

The arc flash protection boundary and incident energy estimates may depend on the electrical equipment or apparatus configuration, for example whether the electrodes have a horizontal or vertical orientation, and whether the system is enclosed, or operates in open air. Interpolation and weighting may be linear, nonlinear, or both. In addition, the voltage reference points may be ordered, for example with $V_1<V_2<V_3$, and selected from values of approximately 600 V, 2.7 kV, and 14.3 kV, or from values of approximately 208 V and 480 V as well.

DETAILED DESCRIPTION

Figure 1A:
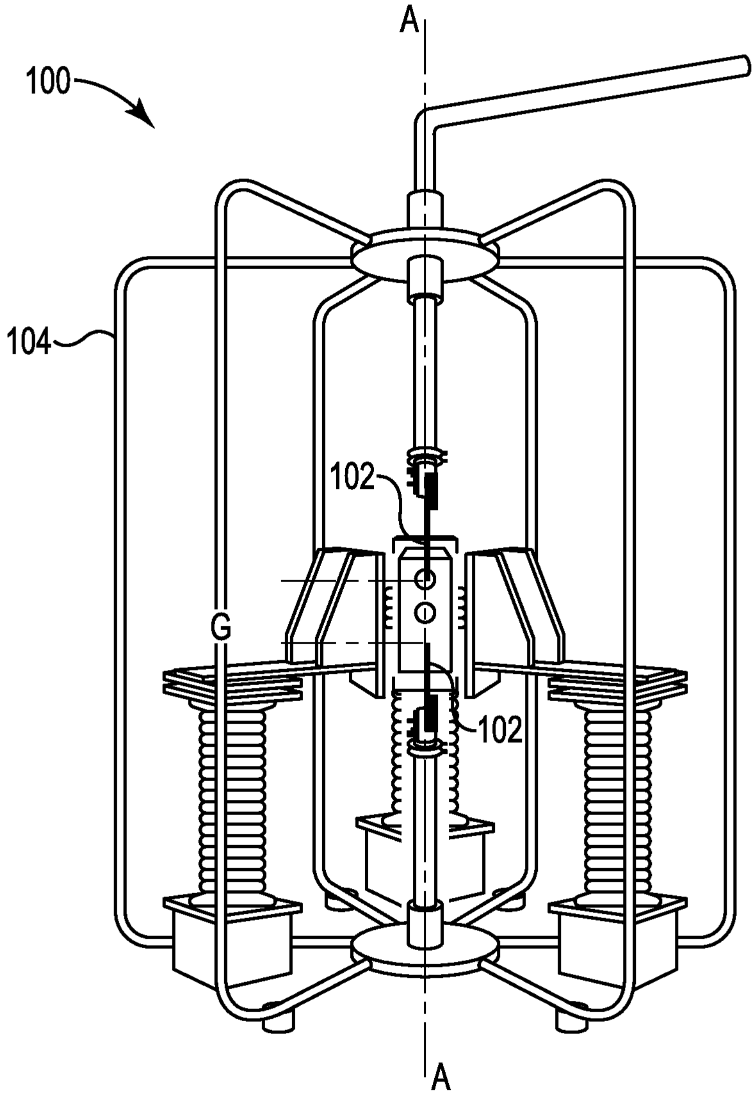
FIG. 1A is a schematic illustration of a single-phase, open-air arc flash test configuration.

This disclosure describes models, systems, procedures and analysis methods for calculating the potential incident energy exposure to arc flash events, for personnel working on or near electrical equipment. The systems and models enable determination of the predicted maximum incident thermal energy, and the corresponding arc flash protection boundary. The procedures, processes and analysis methods cover the collection of field data, selection of power system operating scenarios, data processing, calculating parameters, and analysis of results. Applications include, but are not limited to, enclosed electrical equipment and cables for three-phase AC voltages from about 200 V (or 208 V) to about 15,000 V (15 kV).

In general, the purpose of arc flash analysis is to assess potential arc flash hazards and the corresponding risk of injury. In particular, it is necessary to address the highly specific and complex physics and engineering aspects of arc flash events, in order to provide useful, reliable guidelines for use in actual practice, across a broad range of different electrical equipment and work environments. In developing improved arc flash hazard assessment techniques, therefore, it is important to understand the various risk factors, and how they combine to produce highly unpredictable and unexpected arc flash hazards. In addition, it is critical to understand how these hazards can be quantified, in order to provide guidelines and procedures that promote the greatest possible level of overall workplace and environmental safety.

This process is highly complex and nonlinear, and the results are extremely difficult to predict on a priori basis, without substantial research, experimentation, verification, testing, and analysis, as described herein. In particular, the process must accommodate unknown and uncertain effects that may result from innumerable different possible combinations of the individual risk factors described in the following references, each of which is incorporated by reference herein.

NFPA 70E, Standard for Electrical Safety in the Workplace, 2012 Edition, National Fire Protection Association, Quincy, Mass., 2011 (NFPA Std 70E).

IEEE Guide for Performing Arc-Flash Hazard Calculations, IEEE Std 1584-2002, September 2002 (IEEE Std 1584-2002).

R. L. Doughty, T. E. Neal, and H. L. Floyd, II, "Predicting incident energy to better manage the electric arc hazard on 600 v power distribution systems," IEEE Transactions on Industry Applications, vol. 36, no. 1, pp. 257-269, January/February 2000 (Doughty IEEE IA36-January 2000).

R. H. Lee, "The other electrical hazard: electric arc blast burns," IEEE Transactions on Industry Applications, vol. 18, no. 3, pp. 246-251, May/June 1982 (Lee IEEE IA18-March 1982).

T. Gammon and J. Matthews, "Incident energy factors and simple 480-V incident energy equations," IEEE Industry Applications Magazine, vol. 11, no. 1, pp. 23-31, January/February 2005 (Gammon IEEE 2005 IA11-January 2005). —R. H. Lee, "Pressures developed by arcs," IEEE Transactions on Industry Applications, vol. IA-23, no. 4, pp. 760-764, July/August 1987 (Lee IEEE IA23-April 1987).

T. E. Neal, A. H. Bingham, and R. L. Doughty, "Protective clothing guidelines for electric arc exposure," IEEE Transactions on Industry Applications, vol. 33, no. 4, pp. 1041-1054, July/August 1997 (Neal IEEE IA33-April 1997).

R. L. Doughty, T. E. Neal, T. A. Dear, and A. H. Bingham, "Testing update on protective clothing & equipment for electric arc exposure," IEEE Industry Applications Society Magazine, vol. 5, no. 1, pp. 37-49, January/February 1999 (Doughty IEEE IA5-January 1999).

R. L. Doughty, T. E. Neal, T. L. Macalady, V. Saporita, and K. Borgwald, "The use of low-voltage current-limiting fuses to reduce arc-flash energy," IEEE Transactions on Industry Applications, vol. 36, no. 6, pp. 1741-1749, November/December 2000 (Doughty IEEE IA36-June 2000).

R. Wilkins, M. Allison, and M. Lang, "Calculating hazards," IEEE Industry Applications Magazine, vol. 11, no. 3, pp. 40-48, May/June 2005 (Wilkins IEEE IA11-March 2005).

ASTM Standard Test Method for Determining the Arc Thermal Performance of Materials for Clothing, ATSM F-1959/F1959M-05, 1999 Edition (ASTM F-1959).

NFPA/IEEE Research and Testing Planning Committee (RTPC) Report, 2005 (NFPA/IEEE RTCP 2005).

While these references describe individual risk factors, and particular ways that they may interact, the number of potential combinations and contributions is essentially unlimited, and the results are exceedingly difficult to predict in a reliable and straightforward way. This, in turn, raises new problems and challenges, which were not previously recognized or addressed. The thermal risk factors for arc flash hazards are considered first, followed by improved modeling and assessment techniques. Non-thermal effects are also considered.

1. RISK ASSESSMENT

Annex D NFPA 70E, Standard for Electrical Safety in the Workplace, 2012 Edition, National Fire Protection Association, Quincy, Mass., 2011 (NFPA Std 70E) presents several widely accepted methods for calculating incident energy and the arc flash protection boundary, including the method contained in IEEE Guide for Performing Arc-Flash Hazard Calculations, IEEE Std 1584-2002, September 2002 (IEEE Std 1584-2002). The annex also presents calculation methods based on R. L. Doughty, T. E. Neal, and H. L. Floyd, II, "Predicting incident energy to better manage the electric arc hazard on 600-V power distribution systems," IEEE Transactions on Industry Applications, vol. 36, no. 1, pp. 257-269, January/February 2000 (Doughty IEEE IA36-January 2000) and R. H. Lee, "The other electrical hazard: electric arc blast burns," IEEE Transactions on Industry Applications, vol. 18, no. 3, pp. 246-51, May/June 1982 (Lee IEEE IA18-March 1982). The Doughty, Neal, and Floyd equations can be used to predict maximum incident energy (Equations 1 & 2) and the corresponding flash protection boundary (Equations 3 & 4), in three-phase systems rated at 600 V or lower.

$$IE_{[open\text{-}air]}=5271\times T\times D-1.9593\times[0.0016I_{bf}^{2}-0.0076I_{bf}+0.8938] \quad [1]$$

$$IE_{[box]}=1038.7\times T\times D-1.4738\times[0.0093I_{bf}^{2}-0.3453I_{bf}+5.9675] \quad [2]$$

$$D_{[open\text{-}air]}=[(t/IE_{[open\text{-}air]})\times(8.434I_{bf}^{2}-40.06I_{bf}+4711)]^{0.5104} \quad [3]$$

$$D_{[box]}=[(t/E_{[box]})\times(9.66I_{bf}^{2}-358.7I_{bf}+6198)]^{0.6785} \quad [4]$$

In equations 1-4, IE is the estimated maximum incident energy (in cal/cm$^2$), D is the distance from the electrodes or arc source (in inches), T is the arc duration (in seconds), and $I_{bf}$ is the three-phase, symmetrical bolted-fault current (in kA). These arc equations are based on 25 different 600 V tests, with bolted-fault currents ranging from 16 kA to 50 kA.

Eleven of these tests were conducted in open air. Fourteen tests were conducted in a cubic, ungrounded metal enclosure with dimensions of 20 inches per side, where the vertical electrodes were located 4 inches (about 100 mm) from the rear wall and the electrode tips were terminated in the vertical center of the box. The distance between the calorimeter array (containing seven calorimeters) and the electrodes ranged from 18 to 60 inches (460 mm to 1.52 m). The incident energy was determined from the temperature rise in a copper slug calorimeter array, with maximum incident energy recorded from the calorimeter with the greatest temperature rise.

For open-air, three-phase systems over 600V, NFPA 70E (Section D.6) includes a modified form of Ralph Lee's original arc flash protection boundary equation for calculating incident energy. IEEE Standard 1584-2002 recommends a similar, modified Lee equation (with incident energy and distance expressed in different units) for calculating incident energy with system voltages greater than 15 kV or gap widths outside the original model's range.

The 1584-version of the modified equation is:

$$IE=2.142\times10^{6}\times V\times I_{bf}\times t/D^{2}. \quad [5]$$

The variable IE is the incident energy (J/cm$^2$), and the other variables are defined in Table 1. Equation 5 can also be used to calculate the arc flash protection boundary distance by substituting 5.02 J/cm$^2$ (or about 1.2 cal/cm$^2$) for the incident energy. Generally, the arc flash protection boundary is a distance defined so that the estimated or modeled incident energy exposure will be less than or equal to this predefined limit at the protection boundary distance, and less than this predefined limit outside the protection boundary. The limit of 1.2 cal/cm$^2$ (or 5.02 J/cm$^2$) is determined based on the risk of second degree burns, as described herein.

In the 1584-2002 Standard, the recommendation for using Equation 5 is not limited to open air applications. This equation is generally considered conservative for voltages higher than about 600 V.

Lee developed his original arc flash protection boundary distance equation by representing an arc fault as heat radiation from a spherical object. Equation 6 was based on the "just curable burn," one where the skin temperature remains less than 80° C. Ralph Lee's work was a harbinger in the electrical safety movement in general, and in addressing electrical arc burn hazards in industrial and commercial power systems.

$$D_c=(2.65\times MVA_{bf}\times t)^{0.5} \quad [6]$$

$$D_c=(53\times MVA\times t)^{0.5} \quad [7]$$

In Equations 6 and 7, $D_c$ is the distance in feet, $MVA_{bf}$ is the bolted-fault power in MVA, and T is the number of seconds that the skin is exposed to the arc. In Equation 7, MVA is the transformer rating, with a 1.25 multiplier for ratings below 0.75 MVA.

Ralph Lee's modeling was based on the following premises: the system impedance is purely inductive, the arc is a passive linear resistance, and the arc power is 50% of the bolted-fault VA (maximum power transfer). Under these conditions, the magnitude of the arc voltage equals the magnitude of the system voltage drop and 70.7% ($1/\sqrt{2}$) of the supply voltage.

Additional analysis of the IEEE 1584-2002 data set has shown that the maximum arc power can be significantly less than 50% of the bolted-fault VA, particularly in medium-voltage systems, such as 13.8 kV. Furthermore, the arc voltage in medium-voltage systems, especially for gap widths of 6 inches or less, is typically a small fraction of the supply voltage, as low as about 12%.

Ralph Lee's papers on electrical arc thermal and pressure hazards fueled interest in the electrical engineering community, and led to arc fault testing in the 1990s. Some of these earlier arc data are represented (in the form of averages) in the IEEE 1584-2002 data set, consisting of more than 300 entries and encompassing a range of test conditions. Representative conditions include, for example:

Supply voltage: 208 V to 13.8 kV
Bolted-fault current: 700 A to 106 kA
Gap width: 7 mm to 152 mm (0.28-6 inches)
Grounding: grounded, ungrounded, high-resistance grounded
Configuration: open air, shallow or cubic box (356×305×191 or 508×508×508 mm$^3$)
Arc duration: 31 to 2060 ms
calorimeter distance: 305 to 1829 mm (12-72 inches)

The IEEE 1584-2002, arc current and incident energy equations were formulated from statistical analysis. The logarithmic form of the equation for three-phase arc currents in low-voltage (1 kV and below) systems is:

$$\log I_{arc}=K+0.662\times\log I_{bf}+0.0966V+0.000526G+0.5588V\times\log I_{bf}-0.00304G\times\log I_{bf} \quad [8]$$

In medium-voltage systems (above 1 kV to 15 kV), the logarithmic form of the equation for three-phase arc currents is:

$$\log I_{arc}=0.00402+0.983\times\log I_{bf} \quad [9]$$

In both low and medium-voltage systems, the incident energy, IE (cal/cm$^2$, multiplied by 4.184 for J/cm$^2$) can be calculated from the following equations:

$$\log IE_n=K1+K2+1.081\times\log I_{arc}+0.00110G \quad [10]$$

$$IE=IE_n\times C_f\times(T/0.2)\times(610^x/D^x) \quad [11]$$

The variables in Equations 8-11 are defined in Table 1, and a list of distance factors and plausible arc gap widths for different equipment types are provided in Table 2. Equations 8, 9 and 10 were developed from regression analyses of 76, 25 and 101 test cases, respectively.

TABLE 1

VARIABLE DEFINITIONS (IEEE 1584-2002)

| | |
|---|---|
| $I_{arc}$ | Arc current in kA |
| $I_{bf}$ | Three-phase, bolted-fault (symmetrical RMS) current in kA |
| K | −0.153 (open)<br>−0.097 (box configuration) |
| V | Three-phase supply voltage in kV |
| G | Distance between phase conductors in mm |
| $IE_n$ | Normalized incident energy for an arc duration of 200 ms and for a distance from the arc of 610 mm (24 inches) |
| $C_f$ | Calculation factor: 1.5 on low voltage systems;<br>1.0 on medium voltage systems |
| T | Time duration in seconds |
| D | Distance from arc electrodes (phase conductors) in mm |
| X | Distance factor |
| K1 | −0.792 for open configuration;<br>−0.555 for closed configuration |
| K2 | 0 for ungrounded or high-resistance grounded system;<br>−0.113 for grounded system |

The calculation factor in Equation 11 was introduced to reach a 95% confidence factor in predicting a Personal Protective Equipment (PPE) category that meets or exceeds the incident energy exposure. The 1584 analysis for developing the incident energy equation was based on incident energy level thresholds set at 1.2, 8, 25, 40, and 100 cal/cm$^2$. These thresholds combine the NFPA Table 130.7(C)(16) Hazard/Risk Categories of Category 1 (1.2-4 cal/cm$^2$) and Category 2 (>4 to 8 cal/cm$^2$). Some employers and workplaces do not subdivide or distinguish based on hazard category.

The IEEE Standard 1584-2002 recommends an additional incident energy calculation based on a reduced arc current, which is 85% of the arc current calculated in Equations 8 or 9. If the overcurrent protective device is operating in the steep region of its time characteristic curve, a reduced arc current may significantly delay protective device response time and result in substantially higher incident energy. The arc flash protection boundary can be determined by setting the incident energy in Equation 11 equal to 1.2 cal/cm$^2$ and solving for distance. Alternatively, the incident energy can be defined as IE≤1.2 cal/cm$^2$, in order to define the boundary distance by the range where the estimated exposure is less than or equal to the predetermined limit. Although the 1584 normalized incident energy equation in Equation 10 has a regression R-square of 89%, concern has arisen about the model's ability to predict the incident energy associated with "real-world" arc fault events.

TABLE 2

TYPICAL CONDUCTOR GAP WIDTHS AND RANGES, WITH DISTANCE FACTORS (IEEE Std 1584-2002)

| System Voltage | Type | Gap in mm | Distance factor (X) |
|---|---|---|---|
| 0.208 to | Open air | 32 (10-40) | 2 |
| 1 kV | Switchgear | 32 | 1.473 |
| | MCC and Panels | 25 | 1.641 |
| | Cable | 13 | 2 |
| >1 to | Open air | 102 | 2 |
| 5 kV | Switchgear | 102 (13-102) | 0.973 |
| | Cable | 13 | 2 |
| >5 to | Open air | 153 (13-153) | 2 |
| 15 kV | Switchgear | 153 | 0.973 |
| | Cable | 13 | 2 |

Regression analysis provides relatively simple numerical approximations for quantifying arc behavior over a range of pre-defined test conditions. The regression equations are most reflective of test conditions where the majority of the data is concentrated, rather than a true-to-life representation of the arc phenomenon over the entire range of possible conditions.

Thus, the existing equations may not completely describe known arc fault behavior, when variables or combination of variables (or variable relationships) fall outside the test range. In addition, discontinuities may occur at the voltage threshold separating different low, medium, and high voltage ranges, for example at the 1000 V threshold separating low voltage systems from medium voltage systems in IEEE Std 1584-2002. Other anomalies may also occur, posing a range of new, highly complex challenges for improved arc flash analysis techniques.

2. DEFINITIONS

For this purposes of this disclosure, the following terms and definitions are applied. These definitions are inclusive, rather than exclusive, and other meanings are also encompassed, as known to persons of ordinary skill in the art. In particular, these terms also encompass various definitions provided in IEEE Std 1584 and NFPA Standard 70E, as incorporated by reference herein.

Arc flash. An energetic event resulting from formation of an electric arc between energized electrodes of different voltage or phase, or between an energized electrode and ground, in which sufficient energy is released to pose a risk of injury or harm. Are flash may result from contact between an energized electrode and a metallic tool, test probe, under-rated instrument or loose part, or other short circuit or ground fault event. Arc flashes typically generate heat, noise, light, smoke, and explosive shock, positing the risk of physical injury including burns due to thermal energy exposure and ignition of clothing. Cover panels, loose parts, tools, and other components may be ejected, posing additional risks of injury.

Arc flash protection boundary. An approach limit or distance from a prospective arc flash source, within which a person would be exposed to sufficient thermal energy due to pose a risk of second degree burns, if an electrical arc flash were to occur. The arc flash protection boundary is determined by electrical configuration of the prospective source, including source voltage and current characteristics.

Arc flash hazard. A risk condition associated with the potential release of energy from an electric arc or arc flash event. Arc flash hazards encompass thermal energy exposure explosive shock, and other forms of energy release, not limited to the risks of direct exposure to electrical current.

Arc flash hazard analysis. The study of potential exposure to arc flash energy, including risk analysis for injury prevention and determination of safe work practices. Arc flash hazard analysis may include, but is not limited to, determination of the arc flash protection boundary for a potential arc flash source configuration, and recommendations for appropriate levels of personal protective equipment and other safe work practices.

Arcing fault current (or arc fault current). The arc fault current flowing through an electrical arc plasma, for example in an arc flash event.

Available fault current. The electrical current that can be provided to a potential arc flash source or electrode configuration, based on the current and voltage characteristics of the serving utility, the local electrical device configuration, and the impedance of the current path along which the available fault current is defined.

Available short circuit current. The maximum current that can be delivered through a given circuit to a negligible-impedance current path, at a given point in the circuit, or at any other point that will cause the highest such current to flow. The available fault current and the available short circuit current may be equivalent for a zero fault impedance.

Bolted fault. A short circuit condition in with substantially zero impedance at the point of the fault, or in which substantially zero impedance is assumed.

Circuit. A conductor or system of conductors through which an electric current flows, or is intended to flow.

Electrical hazard. A condition in which inadvertent or unintentional contact or equipment failure may result in shock, arc flash burn, thermal burn, blast, or a substantial risk thereof.

Electrical shock. A physical effect that occurs when electrical current passes through a body.

Electrical utilization equipment. Equipment that utilizes electric energy for electronic, electromechanical, chemical, heating, lighting, or similar purpose.

Energized. Electrically connected to a voltage, or a source of voltage.

Exposed. Capable of being inadvertently touched or approached nearer than a safe distance, as applied to an electrical conductor or circuit part, including energized electrical conductors and circuit components exposed to inadvertent touch or approach by a person. Exposed parts include electrical conductors or circuit components that are not suitably guarded, isolated, or insulated.

Fault current. A current that flows from one conductor to another conductor, or to ground, due to an abnormal connection between the two. Fault current may include an arc fault current in an arc flash event.

Incident energy. The amount of energy exposure on a surface at a given distance from an arc source, for example as generated during an electrical arc or arc flash event. Incident energy may be defined in units of energy per area, for example in joules per centimeter squared ($J/cm^2$) or calories per centimeter squared ($cal/cm^2$).

Qualified analyst. A person with skills and knowledge related to construction, installation, and operation of electrical equipment, with experience in power system studies and arc flash hazard calculations, and arc flash hazard analysis. A person of ordinary skill in the art of arc flash hazard analysis may be a qualified analyst. Alternatively, certification may be required, for example from an industry, professional, or trade group, or from a governmental agency.

Nominal voltage. A nominal value assigned to a circuit or system for the purpose of designating its voltage class. Examples of nominal voltage include, but are not limited to, 120/240 V, 480Y/277 V, and 600 V. The actual voltage at which a circuit operates may vary from the nominal voltage, within a range that permits satisfactory operation.

Working distance. The distance between a potential arc point or arc flash source, and the head and body of a person positioned with respect to that point, for example a worker positioned to perform a particular task on or near an electrical circuit associated with the potential arc point.

3. TESTING CONFIGURATIONS

In order to improve arc flash event modeling and risk analysis, an extensive research program was conducted. This program included approximately one thousand different high-power arc flash experiments, developed over a period of years to investigate the basic electrical characteristics of arc flash events, and the resultant incident energy levels. Ultimately, these efforts lead to an extensive database of arc flash event parameters, which were utilized to develop improved arc flash modeling and assessment tools, as described below.

Figure 1B:
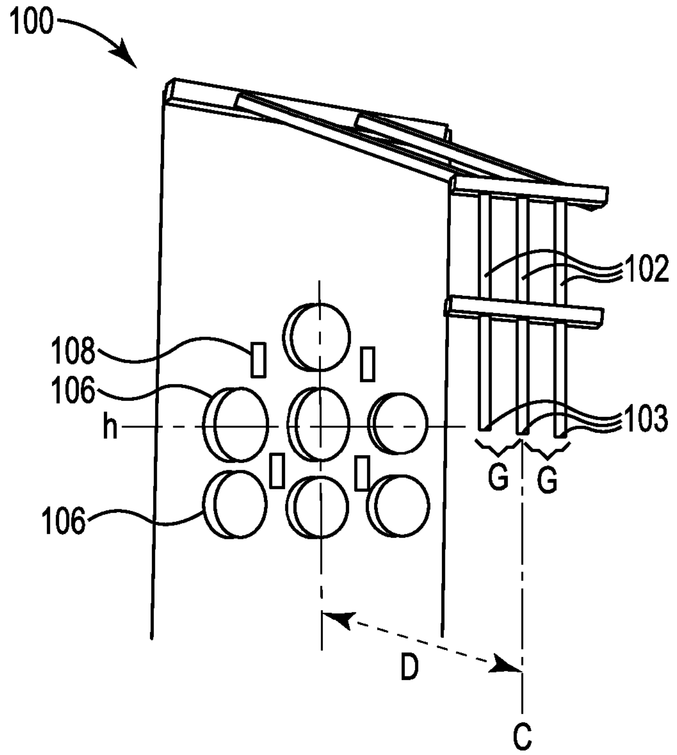
FIG. 1B is a schematic illustration of a three-phase, open-air arc flash test configuration with vertical electrode configuration.
Figure 1C:
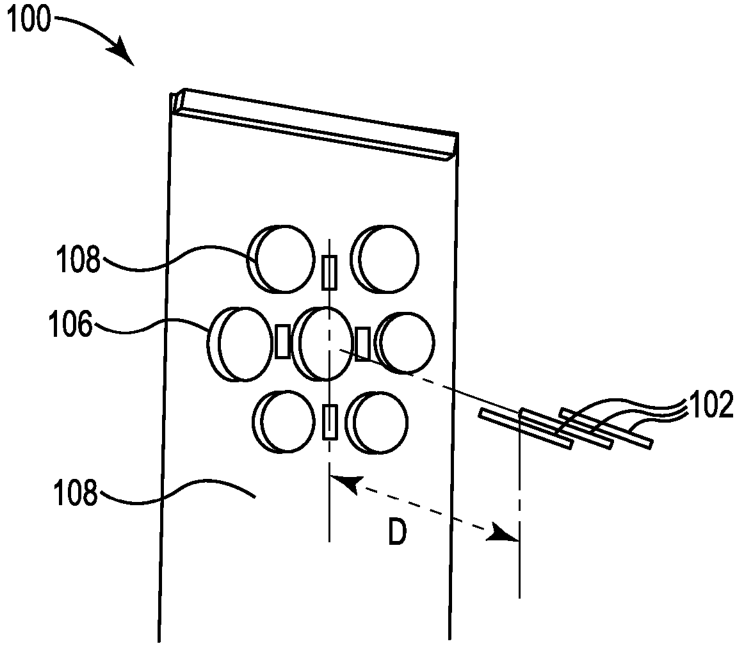
FIG. 1C is a schematic illustration of a three-phase, open-air arc flash test configuration with horizontal electrode configuration.
Figure 1D:
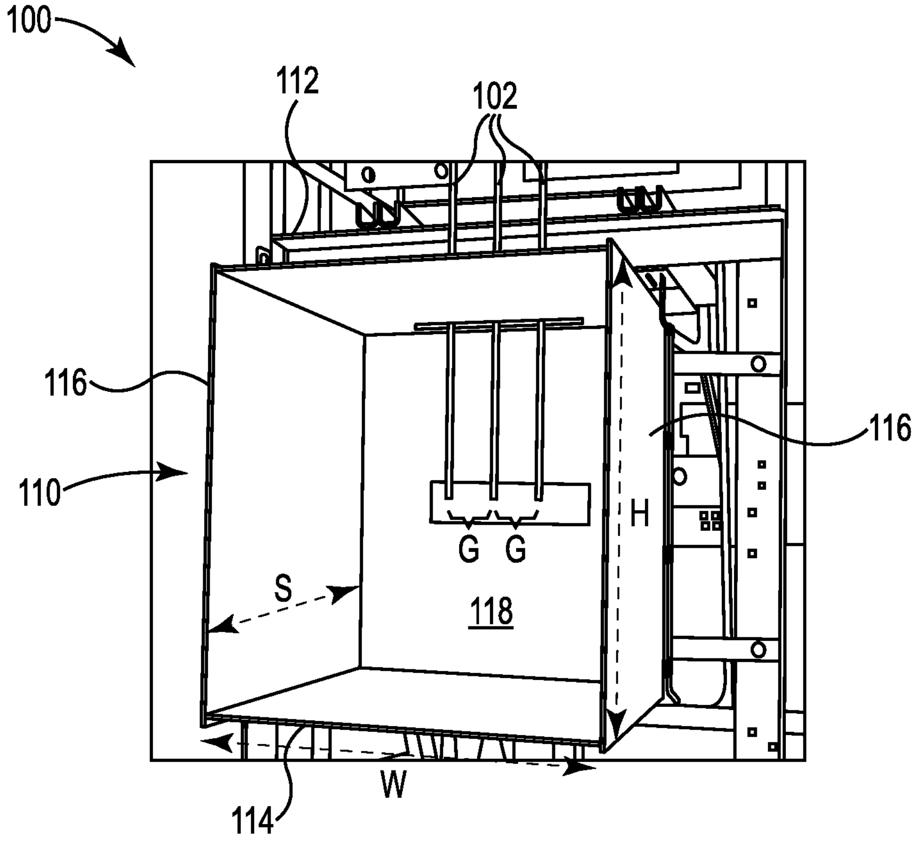
FIG. 1D is a schematic illustration of a three-phase, enclosed arc flash test configuration.

FIGS. 1A-1D are schematic illustrations of representative arc flash event test configurations. These include, but are not limited to, single-phase, open-air arc flash tests (FIG. 1A); three-phase, open-air arc flash tests in both vertical (FIG. 1B) and horizontal electrode orientations (FIG. 1C); and three-phase, enclosed arc flash tests (FIG. 1D).

As shown in FIG. 1A, single-phase tests were performed in an open-air configuration for test apparatus 100, with in-line electrodes 102 spaced apart by variable gap distance G along a common (vertical) axis A, within a partial Faraday cage or Faraday shield structure 104. In one particular example, electrodes 102 are formed of copper material, for example 1 inch (25.4 mm diameter) round copper rod. Other suitable materials may also be used, for example steel, aluminum, brass, and other conducting metals, in various round, oval, oblong, rectangular, square, polygonal, and other shapes, and in various different dimensions.

In the open air configuration of FIG. 1B, test apparatus 100 includes three-phase electrodes 102, in a generally parallel and vertical configuration with individual spacing or gaps G between adjacent pairs of electrodes 102. Typically, gaps G are substantially equivalent between each pair of electrodes 102, but this is not necessarily the case in every configuration.

Calorimeters 106 are arranged in an array, in order to determine incident energy at various distances D from electrodes 102, which represent the arc source. For example, copper slug calorimeters may be used, or other thermal energy-sensitive devices. Additional sensors 108 may also be included, for example thermocouples or other temperature sensors, light sensors, pressure transducers, and other sensing devices 108, as described below.

In the particular configuration of FIG. 1B, an array of seven copper calorimeter sensors 106 is positioned in front of test electrodes 102, at a distance D from centerline C of middle electrode 102. A set of three calorimeters 106 is located in a horizontal row at the same height as tips 103 of electrodes 102, and a second row of three calorimeters 106 is positioned about 6 inches below the first row. A single calorimeter 106 is located about six inches above the tip 103 of the center electrode 102, aligned along center electrode 102 with the middle calorimeters 106 in each row.

FIG. 1C shows an alternate open-air configuration for test apparatus 100, with three-phase electrodes in a horizontal orientation. In this configuration, the arrangement of sensors 106 and 108 is similar, but incident energy analysis is also sensitive to electrode orientation and resulting plasma properties, as described below.

As shown in FIG. 1C, an array of seven (e.g., black-painted) copper slug calorimeters 106 may be used to measure incident energies at different distances D from the electrodes 102. In this particular spatial arrangement, the middle row, center calorimeter 106 is placed in-line with the tip of the center electrode 102.

During an arc test, each calorimeter 106 experiences a temperature rise, which is converted to incident energy. Although model development for the incident energy function (or equation) is based on the maximum incident energy ($IE_{max}$) associated with the highest temperature rise experienced by any single calorimeter 106 during any given arc test, the overall and row average incident energies provide additional insight into understanding thermal flow and the resulting heat levels that are experienced. In particular, these data indicate that the bolted fault current $I_{bf}$, electrode orientation (e.g., horizontal or vertical), and the presence of an enclosure all strongly impact incident energy IE.

FIG. 1D shows an enclosed configuration for test apparatus 100, with three-phase electrodes 102 extending into a panel box or other enclosure 110. In the examples of FIGS. 1B and 1C, electrodes 102 may be formed of 0.75 inch (about 19 mm) hard drawn copper wire, for example with larger bus gaps G, or 0.25 inch by 0.75 inch (6.35 mm by about 19 mm) copper bus bars, for example with smaller bus gaps G.

Enclosure 110 has height H between top and bottom panels 112 and 114, width W between side panels 116, and depth S is from back panel 118 to the front of enclosure 110. In one particular example, dimensions H, W, and L are each about 20 inches (508 mm), for example as utilized in a medium-voltage enclosure, but these dimensions generally vary based on application. Enclosure 110 may also be provided in an open configuration, without one or more of top, bottom, and side panels 112, 114, and 116, or with only back panel 118.

The particular arrangements of incident energy, temperature, light, and pressure sensors 106 and 108 shown in FIGS. 1B and 1C are merely representative, and vary from application to application. In particular, different arrangements of sensors 106 and 108 may also be provided in the single-phase test configuration of FIG. 1A, and in the enclosed test configuration of FIG. 1D. Various combinations of the different test configurations are also possible, for example enclosed single-phase tests, in either horizontal or vertical electrode orientation, and enclosed three-phase tests with a horizontal electrode configuration. Different fusing and circuit breaker configurations are also utilized, in order to determine the corresponding effects on arc current, arc duration, and other arc flash event characteristics relevant to arc flash hazard analysis.

Depending upon test configuration, convective heating may dominate over radiative processes. Thus, colorimeters 106 may register substantially higher incident energy when located in the path of the ejected plasma, for example in the front of horizontally oriented electrodes 102, as shown in FIG. 1C, or in front of an enclosed test enclosure 110, as shown in FIG. 1D. In particular, for arc flash events where a substantial fraction of the arc power is stored as enthalpy in the high temperature plasma cloud, convective heating due to contact with the plasma (or high temperature gas generated by the plasma) may be three times higher than heating due to radiation alone. Alternatively, for indirect exposure the incident energy may be somewhat less, particularly where the primary energy transport mechanism is radiative, rather than the convective.

Figure 2A:
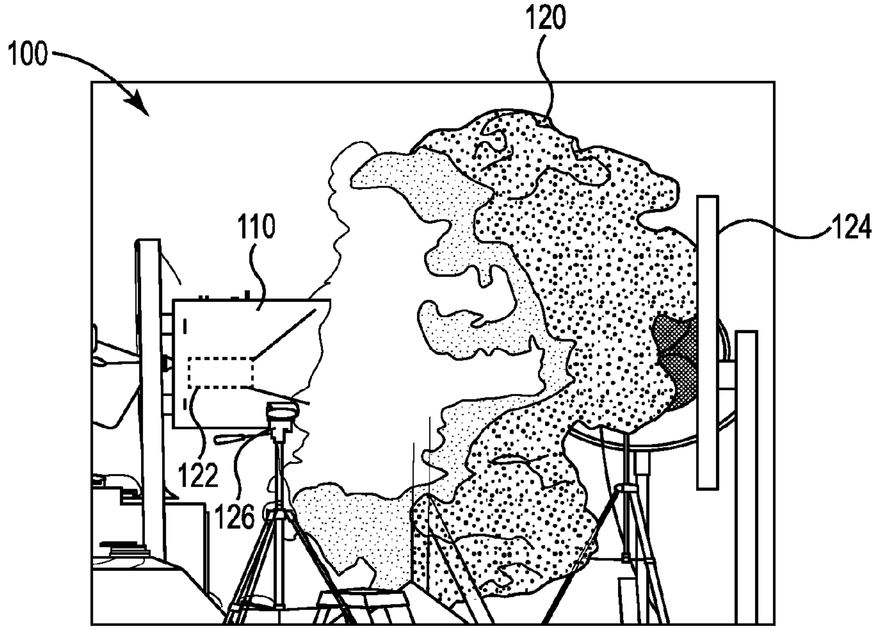
FIG. 2A is an image of a representative arc flash event.

FIG. 2A is an illustration of a representative arc flash (or arc flash event) 120 in a test apparatus 100, for example with a set of arcing electrodes or other arc source 122 located inside enclosure 110. Sensor array 124 includes various calorimeters and other incident energy, temperature, and pressure sensors 106 and 108, as described above. Cameras and other infrared, ultraviolet, or optical sensors 126 may also be utilized, in order to further characterize the features of arc flash 120.

As shown in FIG. 2A, arc flash events 120 may be highly energetic, resulting in substantial of injury to exposed personnel, including burns and shock effects. These risk factors depend upon the arc voltage, arc current, and other arc flash characteristics, which can be utilized to model the event and determine appropriate safety guidelines.

Figure 2B:
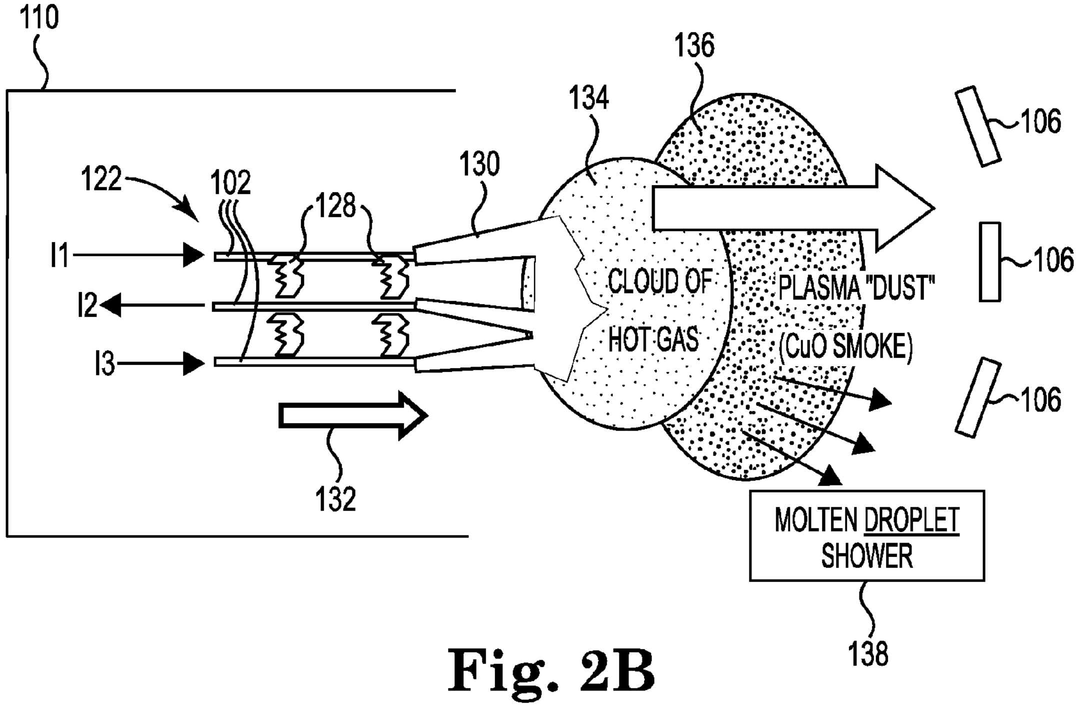
FIG. 2B is a schematic illustration of the arc flash event.

FIG. 2B is a schematic illustration of arc flash event 120, as shown in FIG. 2A. In this particular example, arc source 122 includes horizontally oriented electrodes 102 with three-phase current input I1, I2, I3.

Individual arcs 128 are formed between adjacent electrodes 102, or between one or more electrodes 102 and ground. Once formed, arcs 128 may be self-sustaining, as long as sufficient source current and voltage are available. Arcs 128 may also generate sufficient thermal energy to vaporize the copper or other material from the surfaces of electrodes 102, generating a high temperature plasma 130 with substantial thermal, electrical and explosive energy.

Depending on the configuration of arc source 122, individual arcs 128 may be driven along electrodes 102 by magnetic field effects, for example in ejection direction 132 (arrow), away from the current source (and arc source 122), exiting from the front of enclosure 110. Ejected plasma 130 generates a cloud of high-temperature gas 134, plasma "dust" or smoke particles 136 (e.g., CuO), and molten droplet stream or spray ("shower") 138, which are ejected from arc source 122 and enclosure 110 in the general direction of arrow 132.

4. TESTING METHODOLOGY

A test method for determining the thermal performance of clothing and other materials subject to electrical arc flash energy is described in ASTM F-1959, as incorporated by reference herein. More generally, the test methodology is defined to enable determination of the incident energy that clothing or other protective material can withstand, up to the point (or exposure level) at which there is a 50% probability that skin under the material would receive a second degree burn. This test methodology may also be used to determine the incident energy to which a worker would be exposed in case of a corresponding arc flash event, in a particular electrical installation.

Incident energy may be determined by calculation based on the temperature rise of one or more calorimeters 106, mounted in front of arc source electrodes 102. For example, the temperature rise in each individual calorimeter 106 can be converted from degrees Celsius to incident energy by multiplying by an appropriate calibration factor, as defined for the desired system of units (e.g., $cal/cm^2$ or $J/cm^2$). Sensor absorption measurements are used to determine the fraction of incident energy absorbed, for example greater than or equal to about 90% for copper calorimeters 106. Thus, the incident and absorbed energy may be considered approximately equivalent, or an appropriate correction may be applied.

In order to simulate particular electrical equipment, copper rod, wire and bus electrodes were used for electrodes 102, as described above. The sets of electrodes 102 were typically vertically oriented in a flat or planar configuration, with side by side spacing G. Arcs were initiated by connecting electrodes 102 at electrode tips 103, for example using a solid 10 or 20 gage (10 AWG or 20 AWG) wire. Support blocks were also utilized between adjacent electrodes, in order to prevent them from bending due to the high magnetic forces experience during the resulting arc flash event.

The bolted fault current available at the test terminals (electrodes 102) was measured by shorting electrodes 102 together at the top. The duration of each arc test was selected to allow a measurable temperature rise in the array of calorimeters 106, to that useful incident energy data were obtained.

Phase currents and voltages were measured digitally, and root-mean-square (RMS) values were computed. Arc power was determined by integrating the products of phase current and voltage, and summing the results. Arc energy was computed by integrating arc power over the arc duration.

In order to reduce arc variability effects, multiple tests were run for each experimental setup, at particular voltage and current levels, and at selected distances D from the arc source (electrode tips 103) to calorimeters 106 and other sensors 108. Where the arc duration may vary from test to test, a time duration correction can be applied to the temperature rise data, in order to report incident energy based on a standard nominal arc duration, for example about 200 ms, or using a different timing standard. Both mean and maximum energy data were provided, for the average and highest incident energy (or temperature rise) determined by the array of calorimeters 106.

5. TEST DATA SUMMARY

Representative three-phase test parameters are provided in Table 3, for approximately one thousand individual arc flash tests in alternating current (AC) systems with open-tipped electrodes, as described above, in open-air (OA) and open-front enclosure (CB) configurations, with both vertical and horizontal electrode orientations. In the enclosed configurations, the electrodes may terminate at the vertical center of the enclosure, or at a bottom barrier (CBB).

TABLE 3

SUMMARY OF TEST PARAMETERS

| Voltage | Bolted Fault Current (kA) | Gap (mm) #1 | Gap (mm) #2 | Gap (mm) #3 | Enclosure Size (in) | Back Panel Distance (mm) |
|---|---|---|---|---|---|---|
| 208 V | 2.5-20 kA | 6.35 | 19.05 | N/A | 14 × 12 × 8<br>8 × 6 × 6 | 12.7 |
| 480 V | 5.0/20 kA | 10.16 | 25.4 | N/A | 20 × 20 × 20 | 101.6/254 |
| 600 V | 5/20/36 kA | 12.7 | 31.75 | 50.8 | 20 × 20 × 20 | 101.6 |
| 2.70 kV | 10/20/33 kA | N/A | 76.2 | 114.3 | 26 × 26 × 26 | 101.6 |
| 4.16 kV | 20/40/63 kA | 38.1 | 76.2 | N/A | 26 × 26 × 26 | 101.6 |
| 14.3 kV† | 10/20/40 kA | 76.2 | 95.25 | 152.4 | 36 × 36 × 36 | 177.8 |

†Test data were obtained at both 13.8 kV and 14.3 kV (see text).

As shown in Table 3, test data span the voltage range from about 208 V to about 14.3 kV, with bolted fault currents ($I_{bf}$) from about 2.5 kA to about 40 kA. Voltage spacing or gap values (G) range from about 6.35 mm (0.25 inch) to about 152.4 mm (6 inches). Typical enclosure sizes range from about 8×6×6 in$^3$ (about 203×212×212 mm$^3$) to about 36 inches on a side, or about (914 mm)$^3$, with back panel distance (spacing to electrode) of about 12.7 mm (0.5 inch) to about 101.6 mm (4 inches), or up to 254 mm (10 inches). In practice, while the majority of test data were obtained at 14.3 kV, tests were also conducted at 13.8 kV. In terms of the modeling process, the 14.3 kV value may thus be used as a reference for estimating the incident energy, but the procedure itself is quite general, as described below. In particular, within any given modeling process, a wide range of test voltages can be used to generate the test data, and different reference voltages or "anchor points" can be used to estimate the model functions.

Generally, three-phase arc flash events pose a greater overall hazard, and open-bus switchyards and open conductor lines where single-phase faults are likely can be addressed using the three-phase models as a guide. In addition, it is widely recognized that line-to-line faults quickly escalate into three-phase faults. Low voltage solidly-grounded system ground faults also escalate into three-phase faults. Low-voltage (LV) grounded and high-resistance system ground faults may not result in significant energy release, as long as the first fault to ground is cleared before a second phase fault occurs, but as this does not always occur, three-phase fault should still be considered a possibility. Similarly, medium voltage (MV), low resistance or reactance grounded system ground faults may also clear quickly, but worst case three-phase fault events must still be considered.

For each voltage level of 480 V and higher listed in Table 1, testing was performed for each combination of bolted-fault current and gap width. For each voltage level of 600 V and higher, the incident energy was measured at three calorimeter distances from the point of arc initiation. Generally, the model may be considered accurate over the range of 50 Hz-60 Hz.

Both bonded (or grounded) and unbonded (ungrounded) tests were performed at 480 V. In the bonded configuration, the enclosure boxes were electrically connected to the neutral conductor, which was grounded at the secondary of the supply transformer. In this configuration, neutral currents appear in the first couple of electrical cycles, during establishment of the arc flash. Since a certain percentage of the current flows through the return path, this has the potential to reduce the total arc energy. However, the amount of current in the return path depends upon the level of current imbalance and ground impedance, and subsequent testing on unbounded configurations may be representative of the worst case scenario.

Based on these tests, some general qualitative observations can be made. Arc time, for example, may have a substantially linear effect on incident energy, while distance from the arc source to the calorimeter or sensing array may have an inverse effect. Since stable arcing events take some time to establish, however, twelve-cycle tests may exhibit more than twice the incident energy exposures than the six-cycle results. Thus, the model is based on a cycle-by-cycle analysis, extracting a higher incident energy per cycle value by excluding the initial time for burning the starter wire.

Depending on configuration, system grounding may improve the fit of the incident energy equation. The system reactance to resistance (X/R) ratio, frequency, electrode material, and other variables, on the other hand, may have little or substantially no effect on the arc current or incident energy, and one or more of these terms may be neglected in some applications. The arc current, moreover, depends primarily on the available fault current, while the bus gap (that is, the distance between electrodes or other conductors at the fault point), the system voltage, and the grounding may generally be considered smaller contributing factors.

In addition, the orientation of the electrodes may determine the direction of the arc plasma flow, as observed in the open-air arc tests (FIGS. 1A, 1B, and 1C). When the calorimeters are placed in front of horizontal oriented electrodes, the arc plasma may be driven directly toward the array, as shown in FIG. 2B. In a vertical (downward) orientation, the arc plasma and hot gas are driven or ejected downward, and may not impinge upon the calorimeters directly.

Consequently, the horizontal orientation may transmit more heat, when the target or worker is aligned along the electrode axis. In an enclosed configuration, moreover, the enclosure itself may direct the arc plasma and hot gas discharge, increasing exposure even when the electrodes are in a vertical orientation. Thus, the electrode orientation and enclosure configuration may both be significant factors in any incident energy analysis. For this reason, the five following configurations were identified:

VCB: Vertical electrodes, Cubic Box (e.g., a cubic or rectangular enclosure or "box")

VCBB: Vertical electrodes, Cubic Box, terminated in a Barrier

HCB: Horizontal electrodes, Cubic Box enclosure

VOA: Vertical electrodes, Open Air
HOA: Horizontal electrodes, Open Air

6. DATA ANALYSIS

Figure 3A:
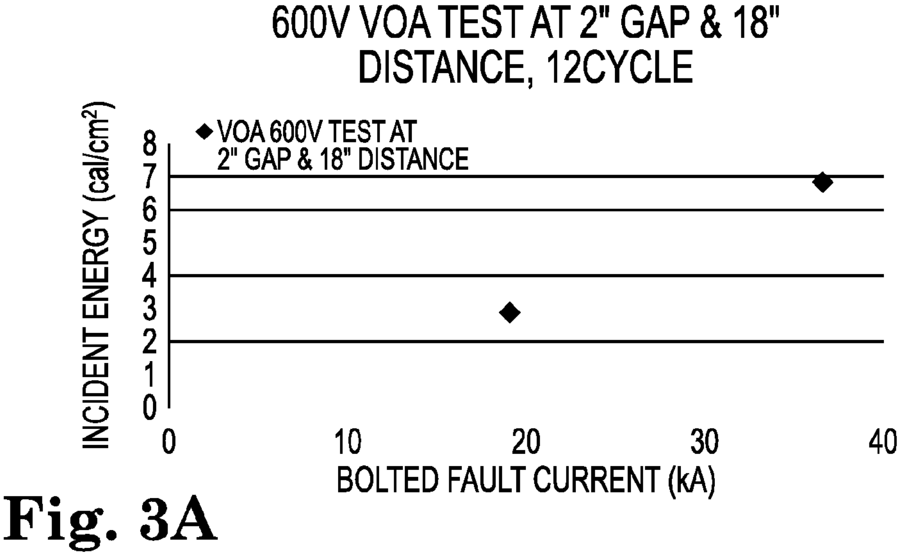
FIG. 3A is a representative energy analysis plot for a test apparatus in a vertical electrode, open-air (VOA) configuration.
Figure 3B:
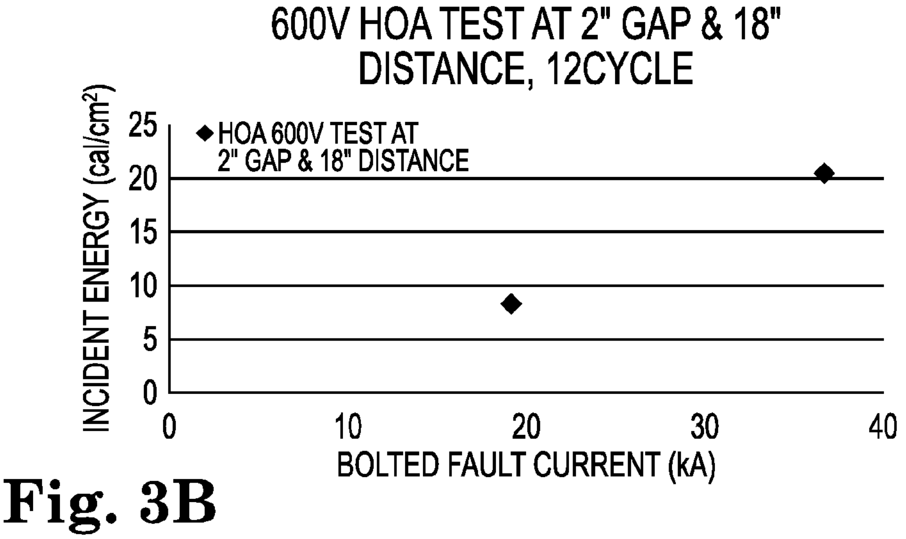
FIG. 3B is an energy analysis plot for the test apparatus in a horizontal electrode, open-air (HOA) configuration.
Figure 3C:
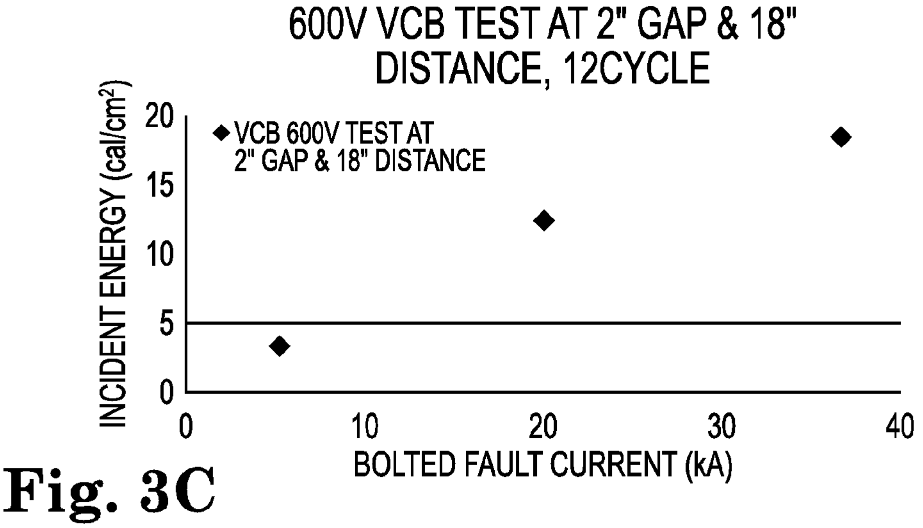
FIG. 3C is an energy analysis plot for the test apparatus in a vertical electrode, enclosed (VCB) configuration.

Representative 600 V energy analysis plots are provided in FIGS. 3A-3B, for a vertical electrode, open air test configuration (VOA, FIG. 3A), a horizontal electrode, open air test configuration (HOA, FIG. 3B), and vertical electrode, enclosed test configuration (VCB, FIG. 3C). These data were obtained with a 2 inch (50.8 mm) electrode spacing or gap G, over a 200 ms exposure (12 cycles at 60 Hz). The distance from the calorimeter to the arc source is about 18 inches (457 mm). Incident energy is given on the vertical axes, with bolted fault current on the horizontal.

As shown in FIGS. 3A-3C, incident energy tends to rise with bolted fault current, as expected. For the open air data, however, there is substantially less incident energy in the vertical electrode orientation (VOA) of FIG. 3A, than in the horizontal orientation (HOA) of FIG. 3B, where the calorimeters are position in the path of the ejected plasma and hot gas discharge. In the enclosed configuration (VCB) of FIG. 3C, however, there is still substantial incident energy, even with vertically oriented electrodes, as compared to the vertical open air configuration of FIG. 3A. This is because the enclosure may direct the discharge toward the calorimeter array, as described above.

Figure 4A:
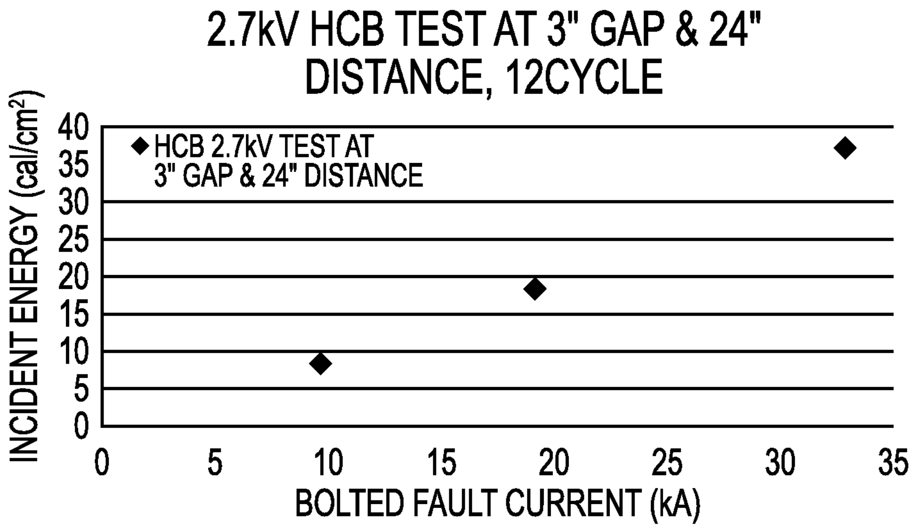
FIG. 4A is a representative incident energy plot for a 2.7 kV test apparatus in a horizontal electrode, enclosed (HCB) configuration, with a 3 inch (76 mm) electrode gap.
Figure 4B:
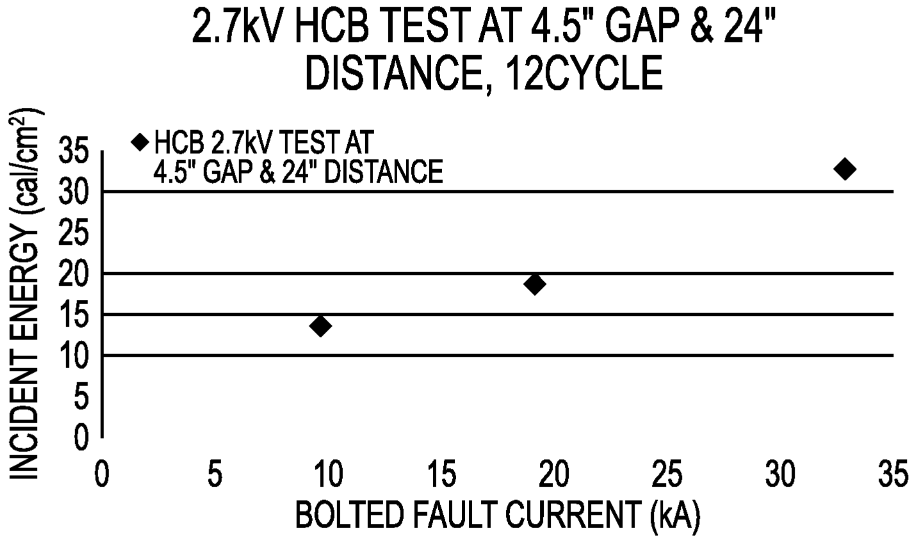
FIG. 4B is an incident energy plot for the 2.7 kV test apparatus, with a 4.5 inch (114 mm) gap.

FIGS. 4A and 4B are representative incident energy plots for a 2.7 kV test apparatus in a horizontal electrode, enclosed (HCB) configuration, at 24 inch (610 mm) calorimeter spacing. In FIG. 4A, there is a 3 inch (76 mm) electrode gap, and in FIG. 4B, the gap is 4.5 inches (114 mm). As shown in the figures, incident energy dependence on the gap width is relatively weak, as described above.

Figure 5A:
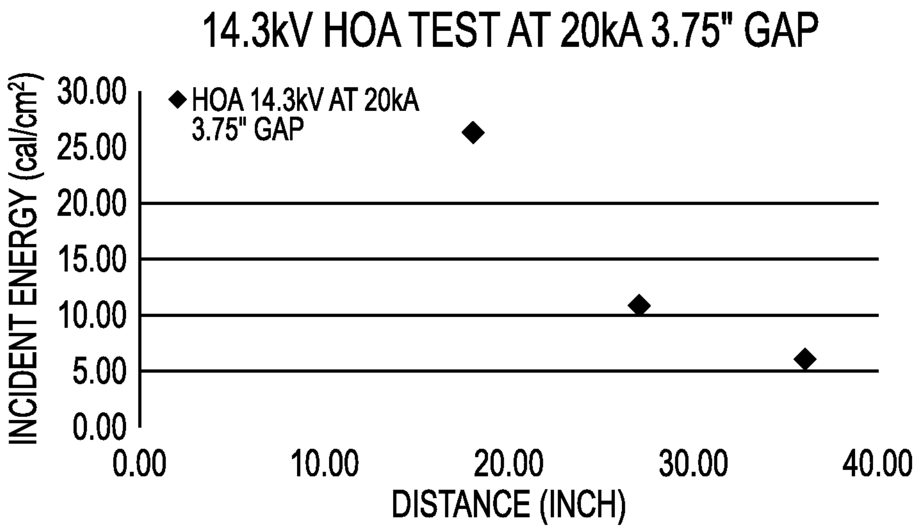
FIG. 5A is a representative incident energy plot for a 14.3 kV test apparatus, in a horizontal open air (HOA) configuration.
Figure 5B:
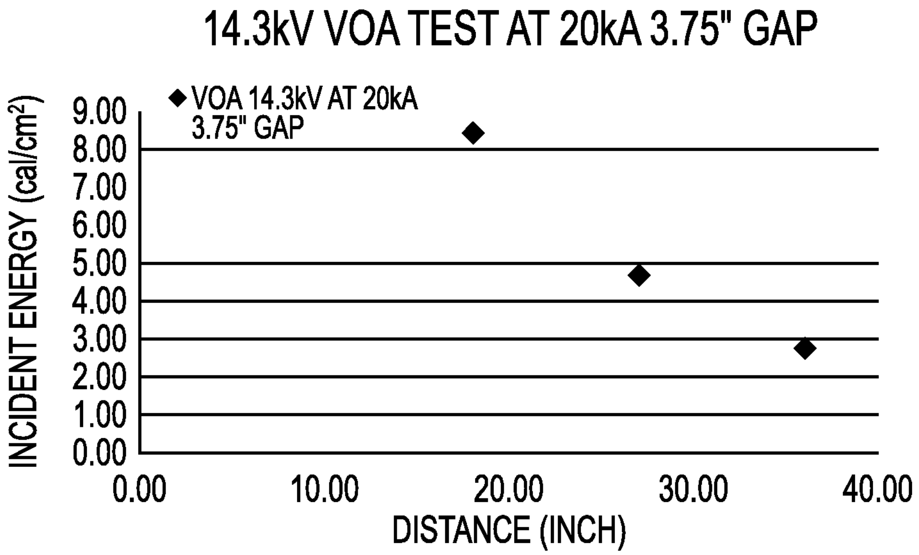
FIG. 5B is an incident energy plot for the 14.3 kV test apparatus, in a vertical open air (VOA) configuration.

FIGS. 5A and 5B are representative incident energy plots for a 14.3 kV test apparatus in a horizontal open air (HOA) and vertical open air (VOA) configuration, respectively, with a 20 kA bolted fault current and 3.75 inch (95 mm) gap between electrodes. Incident energy is plotted on the vertical axes, with calorimeter distance on the horizontal.

As shown in FIGS. 5A and 5B, the incident energy exposure falls off with distance, as expected, and there is substantially more direct energy exposure in the horizontal configuration (HOA, FIG. 5A), as compared to the vertical (VOA, FIG. 5B). The functional form of the falloff is not obvious, however, and appears to be different for the two configurations. Based on this, a number of corrections must be made for configuration, and these corrections with may have a substantial impact on the energy reconstruction across the different voltage, current, and distance ranges.

7. INTERPOLATION AND EXTRAPOLATION

Based on the accumulated data set, both interpolation and extrapolation may be applied to estimate the incident energy and arc current for a given arc flash event, using results from at least three well-modeled or measured voltage points, for example 600 V, 2.7 kV, and 14.3 kV. In particular, a simple, linear interpolation may be used to estimate the incident energy and arc current between 2.7 kV and 14.3 kV, or between other reference voltage $V_N$ and $V_{N+1}$.

Between 600 V and 2.7 kV, the incident energy and arc current may be estimated through a combination of interpolation and extrapolation. For example, a linear interpolation can be performed between 600 V and 2.7 kV, or other reference voltages $V_{N-1}$ and $V_N$, and a linear extrapolation can be performed based on model results for 2.7 kV and 14.3 kV, or other reference voltage $V_N$ and $V_{N+1}$. The estimated incident energy and arc current can then determined by adding proportional contributions of the interpolated and extrapolated terms, for example with a weighted average that utilizes the interpolated values in some voltage ranges, and combines the interpolated and extrapolated values in other ranges, based on various reference voltages $V_1$, $V_2$, and $V_3$.

With respect to lower voltages, it is generally difficult to generate a self-sustaining arc in voltage below about 208 V. At around 215 V, sustained arcing may be attained, but the arcs may be geometrically unstable, jumping from electrode to electrode, or from electrode to enclosure. Nonetheless, arc fault injuries have been sustained in 208 V systems, for example in high current applications, in smaller enclosures. Thus, it is also important to obtain accurate results at this level, including extrapolated data attained at higher voltages. Where measurement and assessment accuracy may be somewhat less, moreover, the model should be constrained to yield conservative results, for example with voltage references such as $V_4$=208 V and $V_5$=480 V.

8. ARC CURRENT

In order to accurately predict the actual response time for protective devices to clear a given fault, the arc current should be accurately modeled. Depending on the reactance/resistance (X/R) ratio of the combined feeding cable impedance and transformer and fault inception angle, for example, the arc or fault current may contain a direct current (DC) component. The decay time of any such DC component depends upon the X/R ratio of the circuit, and may affect clearing time.

Figure 6:
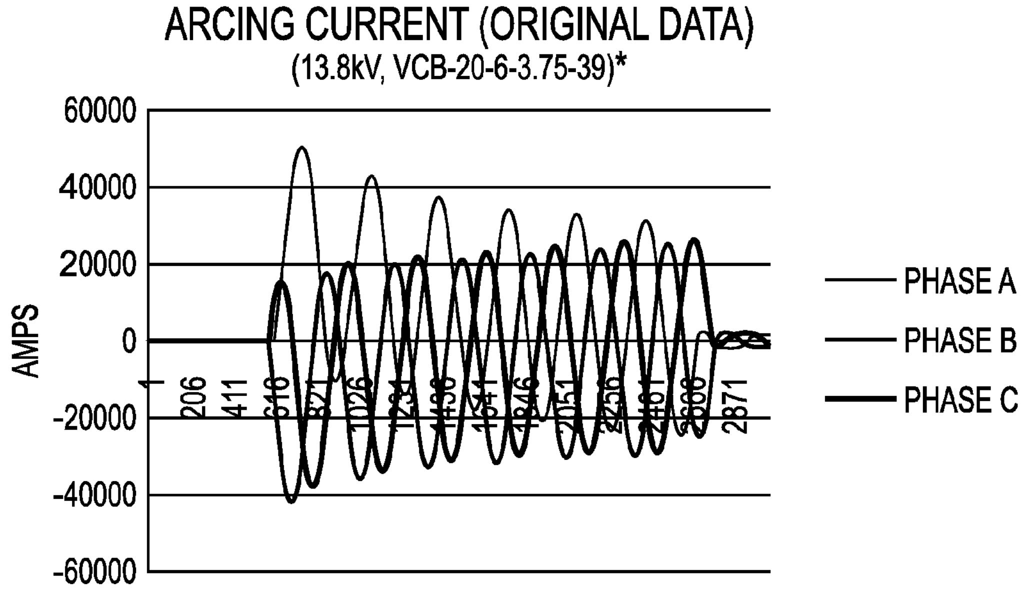
FIG. 6 is a six-cycle time plot of a three-phase arc current, in a 13.8 kV test configuration with a 20 kA bolted fault current.
Figure 7:
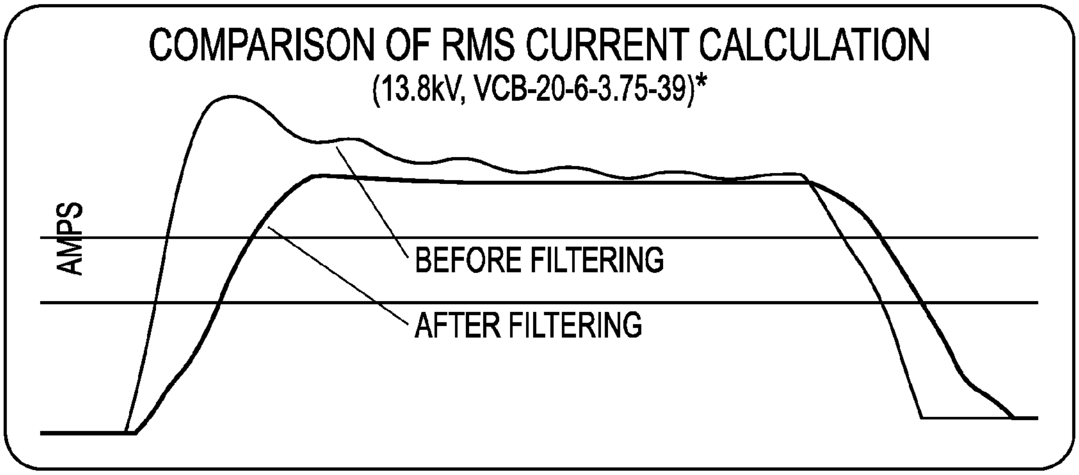
FIG. 7 is a six-cycle time plot of the RMS arc current, comparing filtered and unfiltered signals.

FIG. 6 is a six-cycle time plot of a three-phase arc current for a vertically-oriented, enclosed electrode (VCB) test configuration, operating at 13.8 kV, with a 20 kA bolted fault current and 3.75 inch (about 95 mm) electrode spacing, measured over six cycles with nominal 39 inch (about 1 m) measuring distance (that is, 13.8 kV, VCB 20-6-3.75-39). FIG. 7 is a six-cycle time plot of the RMS current, comparing filtered and unfiltered current values over the six cycle arcing time.

As qualitatively illustrated in FIGS. 6 and 7, an initial DC component at the start of the event may actually make the arc current appear higher than the symmetrical bolted fault current (that is, $I_{arc}>I_{bf}$). This can affect the arc duration estimation, based on the expected relay operation time. The DC offset of the arc current is thus filtered before performing $I_{arc}$ estimation in the model, substantially reducing these effects. The incident energy per cycle calculation, however, is still based upon the original current data.

The measured arc current data are processed by applying a one-cycle, cosine filter to the raw data sample during an arc test, typically at 20 k samples per second (FIG. 7). For each cycle of data in the sliding window, the filter determines the 60 Hz RMS arc current, while removing the DC component and all high frequency harmonics. For a given arc duration, the first and last cycle are based on partially empty data windows, and are discarded. Thus, for a six-cycle arc event, 4 cycles of valid RMS current data are extracted, and for twelve-cycle arcs, ten cycles of valid RMS current data are extracted. These data can be combined or treated independently, and sorted in ascending or descending order to select the higher or lower current data.

For higher voltages (e.g., 2.7 kV and above), the arcing currents are relatively stable. For lower voltage data, however (e.g., 600 V and below), arcing is generally less stable, and the arc current may vary during the timespan of the event, making it more difficult to model $I_{arc}$ based on average laboratory values.

Figure 8:
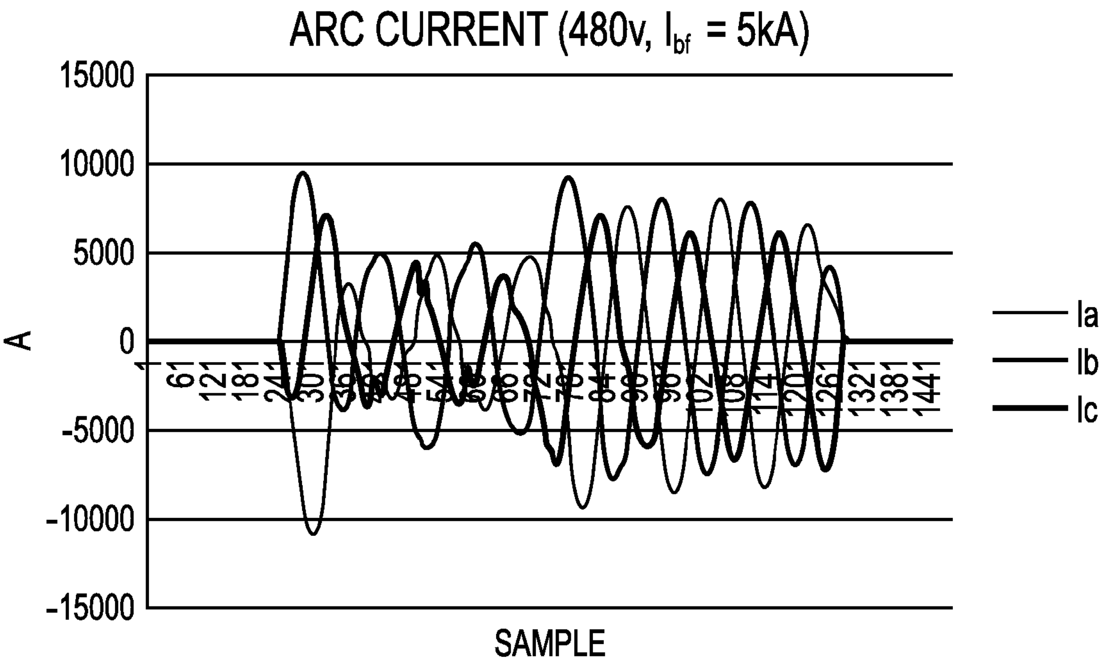
FIG. 8 is a six-cycle time plot of a three-phase, 480 V arc current, with a 5 kA bolted fault current.
Figure 9:
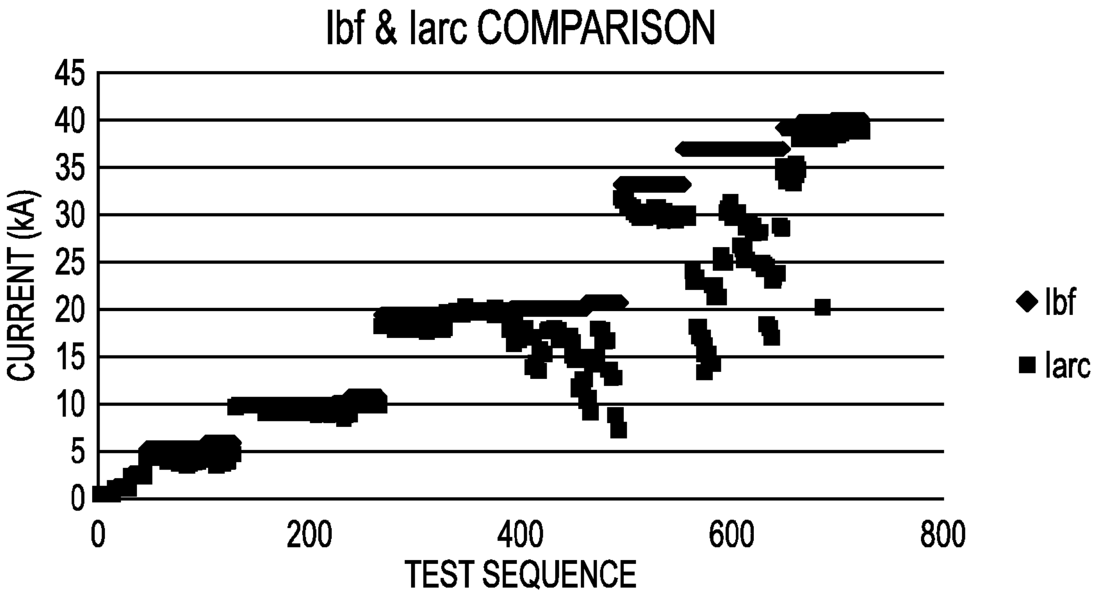
FIG. 9 is a plot of bolted fault current and arc current for a series of representative arc tests, after filtering.

FIG. 8 is a six-cycle time plot of a three-phase, 480 V arc current, with a 5 kA bolted fault current $I_{bf}$. FIG. 9 is a plot of bolted fault current $I_{bf}$ and arc current $I_{arc}$ for a series of representative arc tests, after filtering. As shown in FIG. 8, arcing currents may have a complex time structure during an arc flash event. In particular, the bolted fault current ($I_{bf}$) and the actual arc current ($I_{arc}$) may not be the same, as shown in FIG. 9. Based on this, the arcing current can sometimes be used determine a more accurate clearing time for a particular electrical apparatus or equipment, as described herein. Alternatively, user-provided fault current and clearing times may be utilized, or the estimated arcing current can be used to verify, adjust or modify such user-provided values.

9. ARC ENERGY AND VOLTAGE

In general, arc energy is higher when the rated voltage is increased, for similar configurations. This may be caused by arcing across a wider gap distance, a higher arc current to bolted fault current ratio, or a longer arc column with higher arc voltage, based on the higher rated voltage of the system. Sample results for horizontal and vertical electrode orientation in open air are provided in Table 4A (HOA) and Table 4B (VOA), respectively.

TABLE 4A

ARC ENERGY COMPARISON (HORIZONTAL ELECTRODES, OPEN AIR)

| 600 V, 20 kA (HOA) | | | | 2.7 kV, 20 kA (HOA) | | | |
|---|---|---|---|---|---|---|---|
| G | D | Arc Energy (MJ) | | G | D | Arc Energy (MJ) | |
| (in) | (in) | 6 cycle | 12 cycle | (in) | (in) | 6 cycle | 12 cycle |
| 2.0 | 36 | 0.9196 | 1.8652 | 3.0 | 36 | 2.1033 | 4.1432 |
| 2.0 | 27 | 0.8796 | 1.8959 | 3.0 | 27 | 2.1568 | 4.0150 |
| 2.0 | 18 | 0.8916 | 1.7772 | 3.0 | 18 | 2.1527 | 3.9868 |
| 1.25 | 36 | 0.9890 | 1.9584 | 4.5 | 36 | 2.0908 | 4.1882 |
| 1.25 | 27 | 0.9859 | 1.9153 | 4.5 | 27 | 2.0469 | 4.1318 |
| 1.25 | 18 | 1.0236 | 1.9285 | 4.5 | 18 | 2.0409 | 4.1430 |

As shown in Tables 4A and 4B, the observed arc energy tends to increase with nominal system voltage, with correspondingly larger gap spacing G. Note that the arc energy is nominally independent of measurement distance D, as opposed to the incident energy (IE) exposure, which decreases with measurement distance.

TABLE 4B

ARC ENERGY COMPARISON (VERTICAL ELECTRODES, OPEN AIR)

| 600 V, 20 kA (VOA) | | | | 2.7 kV, 20 kA (VOA) | | | |
|---|---|---|---|---|---|---|---|
| G | D | Arc Energy (MJ) | | G | D | Arc Energy (MJ) | |
| (in) | (in) | 6 cycle | 12 cycle | (in) | (in) | 6 cycle | 12 cycle |
| 0.5 | 36 | 1.0507 | 1.9426 | 3.0 | 36 | 1.9977 | 4.0263 |
| 0.5 | 27 | 0.9954 | 1.8752 | 3.0 | 27 | 2.0207 | 3.8896 |
| 0.5 | 18 | 0.9972 | 1.8592 | 3.0 | 18 | 1.9754 | 3.9059 |
| 1.25 | 36 | 1.0072 | 1.8728 | 4.5 | 36 | 2.4400 | 4.7643 |
| 1.25 | 27 | 1.0027 | 1.9352 | 4.5 | 27 | 2.4020 | 4.6293 |
| 1.25 | 18 | 0.9844 | 1.8876 | 4.5 | 18 | 2.4225 | 4.5813 |

Although the arc energy may be different at different voltages, even for similar test configurations, the ratio of incident energy (IE) to arc energy $E_{arc}$ (for example, in units of cal/cm$^2$/MJ) tends to agree more closely. This is shown in Tables 5A and 5B, for horizontal open-air (HOA) and vertical open-air (VOA) configurations, respectively.

TABLE 5A

IE/ARC ENERGY (cal/cm$^2$)/MJ COMPARISON (HORIZONTAL ELECTRODES, OPEN AIR)

| 600 V, 20 kA (HOA) | | | 2.7 kV, 20 kA (HOA) | | |
|---|---|---|---|---|---|
| | Arc Energy (MJ) | | | Arc Energy (MJ) | |
| D (in) | avg | peak | D (in) | avg | peak |
| 36 | 1.2482 | 1.3116 | 36 | 1.0384 | 1.1091 |
| 27 | 1.9224 | 2.1035 | 27 | 1.7583 | 2.0031 |
| 18 | 3.6633 | 4.5528 | 18 | 3.8888 | 4.9041 |

TABLE 5B

IE/ARC ENERGY(cal/cm$^2$)/MJ COMPARISON (VERTICAL ELECTRODES, OPEN AIR)

| 600 V, 20 kA (VGA) | | | 2.7 kV, 20 kA (VGA) | | |
|---|---|---|---|---|---|
| | (cal/cm$^2$)/MJ | | | (cal/cm$^2$)/MJ | |
| D (in) | avg | peak | D (in) | avg | peak |
| 36 | 0.6332 | 0.6877 | 36 | 0.5375 | 0.5676 |
| 27 | 0.8995 | 0.9955 | 27 | 0.8224 | 0.9010 |
| 18 | 1.8271 | 2.1922 | 18 | 1.6304 | 1.9011 |

For both the HOA and VOA configurations of Tables 5A and 5B, the IE to arc energy or (IE/$E_{arc}$) ratio is slightly lower at 2700 V than at 600 V. This may be due to longer arc column dimension (or farther distance between calorimeter and arc column), and faster plasma flow (that is, a higher arc current may generate greater magnetic force, pushing the ionized gas downward faster). From the standpoint of model development, however, these values are within tolerance.

10. INCIDENT ENERGY MODELING PROCEDURE

Based on test results, the following factors are known to affect measurements of incident energy IE:

Bolted-fault current level ($I_{bf}$)
Voltage level (V)
Gap width between electrodes (G)
calorimeter distance (D) and height (arrangement)
Arc duration (cycles)
Electrode orientation (horizontal or vertical)
Enclosure configuration (BC, OA), dimensions, back panel distance Incident energy values were determined in a manner similar to the arc current. A one-cycle sliding window was used to calculate arc energy per cycle, and the incident energy per cycle was calculated from the ratio of maximum incident energy recorded from any calorimeter to the arc energy measured over the duration of the arc test. Valid data were extracted from the one-cycle sliding window for the six-cycle and twelve-cycle tests, and combined handled in a manner similar to the arc current data processing. Linear regressions were performed on each set of incident energy data, and a total of 15 different incident energy equations were developed, in order to estimate the incident energy at selected reference voltages, for specific tests configurations.

In a more detailed procedure, a number of assumptions may be utilized to drive incident energy (IE) modeling. Based these assumptions, data analysis and model development may be defined according to particular methods and procedures, as described below. Representative assumptions include, but are not limited to:

Per Mega joule (MJ), arc flash energy will create same the temperature rise in the calorimeter, during the same arc flash event. This assumption allows for generating multiple data points from a single event.

Regardless of voltage level, per MJ arc energy will create a similar temperature rise in a calorimeter during the arc flash, if the configurations are identical (electrode gap has minimal influence on this result).

Therefore, it may be assumed that the IE to arc energy ratio is substantially identical for vertical electrode, enclosed (VCB) arc flash events at 600 V, 2.7 kV, and 14.3 kV.

The same assumption may also be applied to vertical, enclosed, barrier configuration (VCBB), and horizontal electrode enclosed configurations (HCB).

This assumption also provides for correction factors when different enclosures are utilized, at different voltage levels, as described below with respect to FIG. 11.

From a statistical point of view, large sample size tends to increase confidence in the results, and production of reliable results is one of the important tasks in the model development process. In particular, larger sample sizes facilitate a more precise determination of the mean, and reduce errors as compared to smaller samples.

In statistics, the level of confidence in a particular result can be quantified through a confidence level or confidence interval (CI). For a sampled distribution, where the mean and standard deviation of the actual population are unknown, the confidence interval for the sample mean depends upon the standard error, which tends to decrease with sample size. Thus, as the sample size increases, the confidence interval narrows.

To estimate the incident energy (IE) in these models, therefore, a 95% confidence interval upper limit may be used. This may be considered a conservative estimate, where there is a 97.5% nominal probability that the actual mean incident energy for given test distribution lies below this estimated upper limit (that is, 2.5% of the range falls below the confidence interval, and 2.5% falls above). As the sample size increases, moreover, the confidence interval tends to decrease in width. This increases accuracy, while retaining a high level of confidence in the upper limit of the estimated incident energy value.

Figure 10:
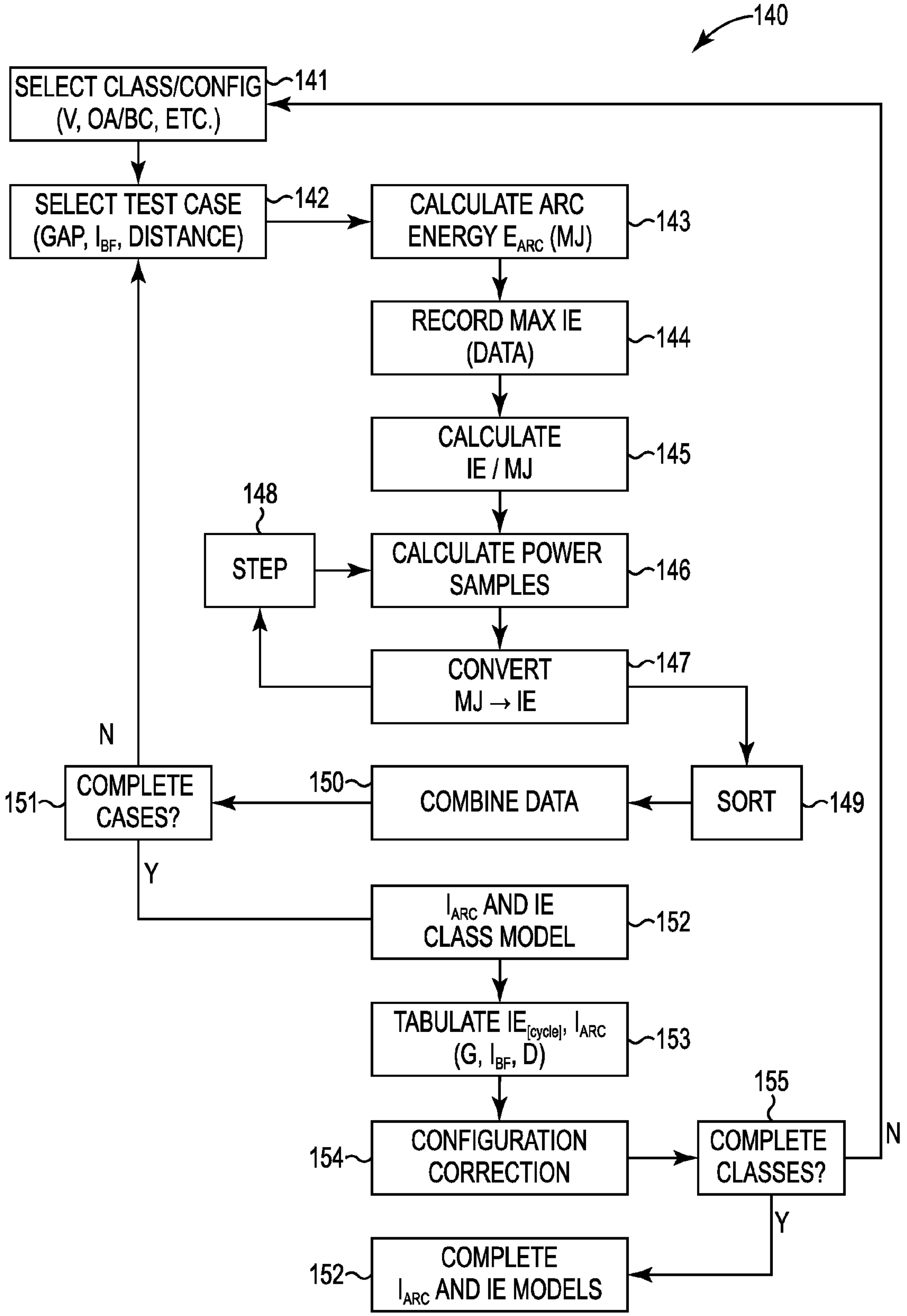
FIG. 10 is a flow diagram illustrating a representative method for modeling incident energy in an arc flash event.

FIG. 10 is a flow diagram illustrating method 140 for modeling incident energy in an arc flash event. Method 140 includes any one or more of the following steps 141-154, which may be completed in any order or combination.

Select configuration and voltage class (step 141). Representative configuration selections include, but are not limited to, vertical open-air (VOA), horizontal open air (HOA), vertical and horizontal enclosed configurations (VCB and HCB), and barrier configurations (VCBB), as described above. Representative voltage selections include, but are not limited to, 208 V, 480 V, 600 V, 2.70 kV, 4.16 kV, 13.8 kV and 14.3 kV. Representative panel dimensions and back panel spacing values include, but are not limited to, the particular values in Table 3.

Select test case (step 142). Representative test case parameter selections include gap spacing (G), bolted fault current ($I_{bf}$), and measuring distance (D), from the calorimeter array to the arc source or arcing point. Representative gap spacings include, but are not limited to, 6.35 mm (0.25 inch), 10.16 mm (0.4 inch), 12.7 mm (0.5 inch), 19.05 mm (0.75 inch), 25.4 mm (1.0 inch), 31.75 mm (1.25 inch), 38.1 mm (1.5 inch), 50.8 mm (2.0 inch), 76.2 mm (3.0 inch), 95.25 mm (3.75 inch), 114.3 mm (4.5 inch), and 152.4 mm (6.0 inch). Representative bolted fault current selections $I_{bf}$ include, but are not limited to 2.5 kA, 5.0 kA, 10 kA, 20 kA, 33 kA, 36 kA, 40 kA, and 63 kA. Representative distances D include, but are not limited to, 18 inches (about 450-500 mm), 24 inches (about 600-650 mm), 27 inches (about 650-700 mm), 31 inches (about 750-800 mm), 36 inches (about 900-950 mm), and 39 inches (about 1 m).

Calculate total arc energy (step 143). Arc energy $E_{arc}$ depends upon the arc current $I_{arc}$ and arc voltage V. Arc current $I_{arc}$ may be approximately equal to the bolted fault current $I_{bf}$, or less, depending on voltage class, electrode configuration and test parameters.

Obtain the maximum value of incident energy IE (step 144). The maximum incident energy $IE_{max}$ is obtained from the recorded data, using the calorimeter with the highest temperature rise (or other measure of thermal energy exposure).

Calculate the incident energy to arc energy ratio (step 145). The energy ratio is defined in units of (cal/cm$^2$)/MJ, or /cm$^2$ with a different constant for IE exposures measured in calories (cal) or joules (J). Two particular values of the energy ratio may be defined, $IE_{max}/I_{arc}$ for maximum values of incident energy IE ($IE_{max}$), and $IE_{avg}/I_{arc}$ for average values of incident energy IE ($IE_{avg}$). Depending on model, it may also be assumed that the energy ratio is substantially identical for vertical electrode, enclosed (VCB) arc flash events at 600 V, 2.7 kV, and 14.3 kV, and for other configurations (e.g., VCBB and HCB).

Calculate power samples (Step 146). For a representative voltage and current sampling rate of 20,000 samples per second, there will be about 333 samples per 60-Hz power cycle (or about 400 samples per 50 Hz cycle). A two-watt meter method can be used to calculate the three-phase instantaneous power, and convert to joules based on the sampling time window.

Converting arc energy to incident energy (step 147). The arc energy for a complete cycle is calculated sample-by-sample, by adding energy from the (e.g., 333 or 400) consecutive sampling points, for example with energy expressed in units of MJ/cycle. The RMS arcing current is calculated from the filtered signal (see FIG. 7), over the corresponding period of the arc flash event. The arc flash energy may be converted to incident energy IE on a cycle-by-cycle basis; that is, converting $E_{arc}$ in MJ per cycle to IE in cal/cm$^2$ per cycle.

Step sample (step 148). The analysis moves forward by one data point, and the procedure is repeated over $N_S$ data points representing the cycle (e.g., 333 or 400, depending on the sampling rate and power cycle frequency).

Sorting IE/cycle (step 149). The IE/cycle data are ordered, or sorted in descending (or ascending) sequence. For example, the highest $N_S \times (N_C - 2)$ data points may be used for incident energy estimation, where $N_s$ is the number of samples per cycle and $N_c$ is the number of cycles in the event. Thus, 1332 data points could be extracted from a six-cycle arc flash test (that is, where $N_S$=333 and $N_C$-2=4).

Thus, lower-valued data in the first and last cycles may be discarded, where the arc current may not be as well defined. In particular, this process should exclude the time required to melt or vaporize the starter wire or other arc trigger. More generally, this may also be considered a conservative approach, which will tend not to underestimate arc flash energetics.

Combining data (Step 150). Data sets for the same test configurations can be combined, and sorted in descending order, with the top 50% of the data points used for IE estimation. Similarly, the average or RMS filtered current values for the first seven (or $N_C$) cycles of the three-phase arc current can be used for $I_{arc}$ estimation. However, calculations for the arc energy ($E_{arc}$/cycle, or MJ/cycle) and incident energy per cycle ($IE_{[cycle]}$) may still be based upon the original (e.g., unfiltered) current data. Statistical analysis is then performed to obtain an average value $(IE_{[cycle]})_{avg}$ and a standard deviation of the IE/cycle distribution $(IE_{[cycle]})_{\sigma}$, and other statistical measures. These measures can be utilized to generate a boundary range for estimating the arc current ($I_{arc}$), for example using a 95% confidence level upper bound, or a one, two, or three-sigma range between upper and lower bounds.

In repeat/complete case step 151, the various steps of method 140 are repeated until all cases within the selected configuration and voltage class have been completed. In modeling step 152, the $I_{arc}$ and $IE_{[cycle]}$ models are obtained as function of bolted fault current, open circuit voltage, gap spacing of the electrodes, and distance to the arcing point, for example through a regression process applied to the particular voltage class and configuration In tabulation step 153, tables or other data structures can be generated and stored in memory for each voltage class and configuration. In particular, the incident energy per cycle ($IE_{[cycle]}$) and arc current ($I_{arc}$) can be tabulated, for each gap distance (g), bolted fault current ($I_{bf}$), and calorimeter or measurement distance (D).

Configuration correction (step 154). Using the incident energy ratio ($IE/E_{arc}$), a correction factor can be established for different enclosure configurations. For example, the incident energy ratio can be determined for different enclosure dimensions and operating voltages, for a given (e.g., VCB) electrode configuration. Curve fitting can be used to estimate the correction factor for different enclosure dimensions, at a specified measurement distance D. Similar procedures for other configurations (VCBB and HCB) and voltages can also be carried out, in order to establish the correction factor for different geometries.

In repeat/complete class step 155, various steps 141-154 of method 140 are repeated for each desired configuration and voltage. Depending upon application, the results for enclosed electrode configurations, for example HCB, VCB, and VCBB, may be normalized to a particular enclosure configuration, for example a 20"×20"×20" (508 mm×508 mm×508 mm) enclosure, with correction factors for other enclosure sizes, as described above.

At model completion step 154, the arc current ($I_{arc}$) and incident energy (IE) models are created for each configuration and voltage class. These models may also be utilized to determine the arc flash protection boundary and other parameters, as described below.

11. MODEL IMPLEMENTATION

Figure 11:
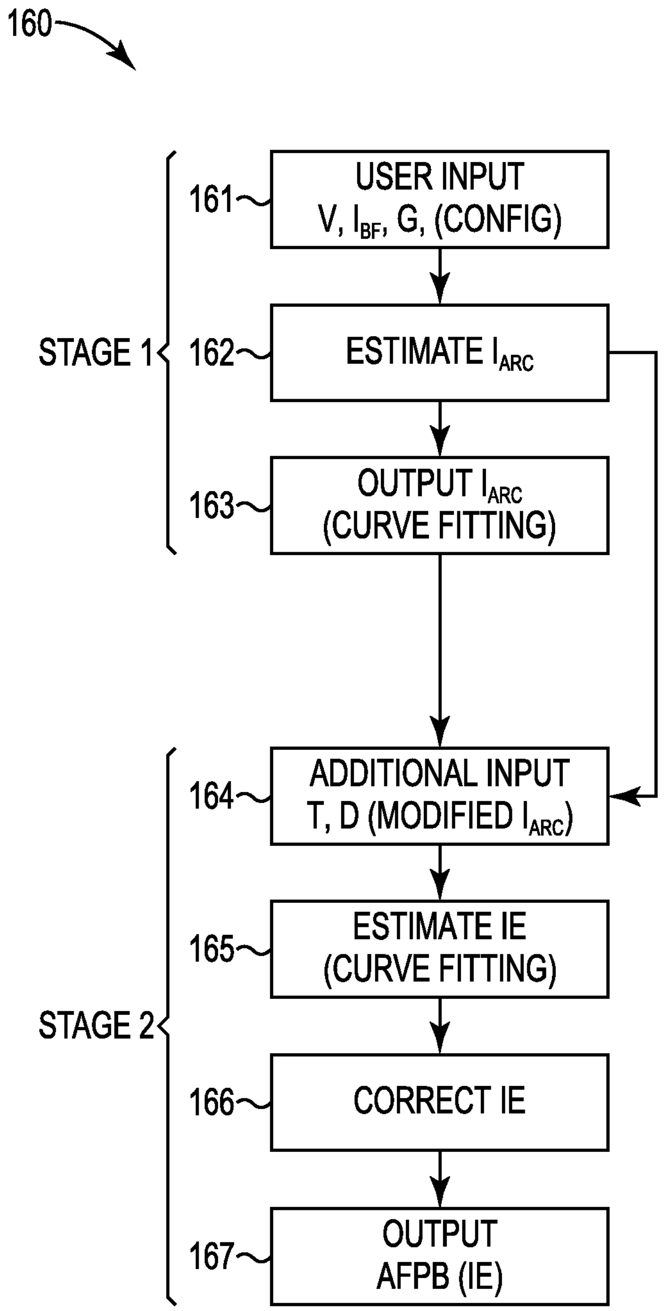
FIG. 11 is block diagram illustrating an exemplary implementation of the incident energy model.

FIG. 11 is block diagram illustrating an exemplary method 160 for implementation of the incident energy model, for example as utilized to generate an arc flash protection boundary. In this particular application, method 160 can be divided into two phases: arc current estimation (Stage 1), and incident energy estimation (Stage 2).

Stage 1 of method 160 may include one or more steps of user input (step 161), arc current estimation (step 162), and arc current output (step 163). Stage 2 of method 160 may include one or more steps of additional user input (step 164), incident energy estimation (step 165), and data output (step 167).

User input (step 161) is performed by receiving data from a user, for example with a laptop or desktop computing device, a tablet computer, a handheld or mobile device, or with a user interface connected to a computer over a network. The user data relate to an electronic system for which an arc flash hazard assessment is desired, and may include an operating voltage or potential (V) and a fault current value (e.g., symmetrical bolted fault current $I_{bf}$). Alternatively, a single-phase line-to-line fault current may be used, or other user-provided estimate of the maximum available short circuit current.

In addition, the user data may also include a gap between electrodes (G) and an electrode configuration, for example HOA, VOA, HCB, VCB, or VCBB. For HCB, VCB, and VCBB configurations, the user data may also include an enclosure size or dimension.

Arc current estimation (step 162) is performed to generate an estimated value for the arc current ($I_{arc}$), based on the user input. In general, the arc current may not the same as the (symmetrical) bolted fault current (or line-to-line fault current), for example due to DC voltages or other asymmetrical contributions, and at lower voltages, where the arc may be unstable.

In one particular application, the arc current can be estimated by curve fitting. For example, the arc current may be calculated based on test data at three or more reference points or reference voltages, and a combination of interpolation and extrapolation techniques can be used, as described below.

The estimated arc current is output at step 163. Alternatively, the estimated arc current may be utilized as an internal variable, which may or may not be output to the user. In additional applications, a user-provided fault current value may be utilized, or the estimated arc current may be used to verify, adjust or modify such a user-provided value.

Additional user input may be provided in step 164. In particular, the user may provide estimated fault duration (or arc duration time) T, based on the expected system response for the estimated arc current $I_{arc}$. The system response may include, for example, a clearing time based on actual breaker time, relay operating time, and any desired safety margin. Depending on application, any user data provided in additional data step 164 may also be provided as an initial input in step 161.

The user (or users) may also provide a working distance D and a modified or user-specified arc current value, based on particular operational characteristics. For example, a current-limiting fuse or similar device maybe used, which would change the response time and may also affect the arc current, or other software or calculations may be used to determine this quantity. Thus, the arc current can also be configured as a user-modified field, and either a calculated or user-supplied value for this parameter can be used, as described above.

In step 165, the incident energy and other parameters are calculated. For example, the arc energy may be calculated from the arc current, voltage, gap, and other parameters, and the incident energy may be determined from the energy ratio, as described above. Typically, the incident energy can also be calculated on a per-cycle basis, where the total energy exposure depends upon the number of cycles that the arc fault lasts, as described above.

In one particular application, a combined extrapolation and interpolation technique is utilized for curve fitting in order to estimate incident energy IE (and arc current $I_{arc}$) at a particular operational or user-supplied voltage V. In this approach, three or more reference points $V_1$, $V_2$, and $V_3$ can be used, for example as selected from among 208 V, 480 V, 600 V, 2.7 kV, and 14.3 kV. A simple, linear interpolation can then be defined between particular pairs of points (e.g., between 2.7 kV and 14.2 kV), and a combination of interpolation and extrapolation can be used between other pairs of points (e.g., between 600 V and 2.7 kV).

In interpolation, the value of a desired function (e.g., IE or $I_{arc}$) between two reference points (e.g., $V_1$ and $V_2$, or $V_2$ and $V_3$) is estimated based on weighting. For example, according to a the linear interpolation approximation, incident energy IE can be estimated for voltages V between two endpoints $V_N \leq V \leq V_{N+1}$, using:

$$IE(V) = IE(V_N) + \frac{IE(V_{N+1}) - IE(V_N)}{V_{N+1} - V_N}(V - V_N). \quad [12]$$

In this expression, $V_N$ and $V_{N+1}$ are two adjacent reference points, and the value of incident energy IE is estimated by (linear) interpolation between reference point $V_N$ and reference point $V_{N+1}$. Similarly, for arc energy Iarc:

$$I_{arc}(V) = I_{arc}(V_N) + \frac{I_{arc}(V_{N+1}) - I_{arc}(V_N)}{V_{N+1} - V_N}(V - V_N). \quad [13]$$

In general, a linear extrapolation can also be utilized, which has the same form as interpolation for voltages V between reference points $V_N$ and $V_{N+1}$. In an extrapolation, however, the range is extended, for example to voltages $V<V_N$ and $V>V_{N+1}$.

A combined approach can also be used, for example between two points $V_{N-1} \leq V \leq V_N$. In this approach, the interpolation between adjacent reference points $V_{N-1} \leq V \leq V_N$ is combined in a weighted sum with an extrapolation based on points $V_N$ and $V_{N+1}$, where the weight depends on the fractional distance between the first pair of adjacent reference points. For example, $$IE(V) = IE_{int}(V_{N-1}, V_N)\frac{V_N - V}{V_N - V_{N-1}} + \frac{V - V_{N-1}}{V_N - V_{N-1}}IE(V_N, V_{N+1}). \quad [14]$$

In this expression, $IE_{int}(V_{N-1}, V_N)$ is the interpolated value of incident energy IE at voltages V between reference point $V_{N-1}$ and $V_N$, and $IE_{ext}(V_N, V_{N+1})$ is the extrapolated value at voltage V, based on reference points $V_N$ and $V_{N+1}$. Alternatively, the weighting between the interpolated and extrapolated terms can be different. For example, both the interpolated and extrapolated terms may have non-zero weighting in one interval $(V_{N-1}, V_N)$, for example a relatively lower voltage interval, while the extrapolated weighting may be substantially zero in another interval $(V_N, V_{N+1})$, for example a relatively higher voltage interval, or vice-versa. Second-order or higher-order interpolation and extrapolation techniques may be used, or another curve fitting function, as known in the art. For the arc current the result is similar. Other parameters can also be estimated in a similar manner, for example arc energy $E_{arc}$, or these parameters can be determined from the estimated (interpolated and extrapolated) values of incident energy IE and arc current $I_{arc}$, in combination with any other parameters such as gap width G, distance D, and voltage V, and based on the configuration of the potential arc source.

In step 166, the incident energy (and any other desired parameters) may be corrected for enclosure dimension. For example, the incident energy IE and arc current $I_{arc}$ estimations can be normalized to a particular enclosure dimension, as described above, and then corrected for actual size using a correction factor based on the test data.

In output step 167, data related to arc flash assessment are output to the user, for example using a computer or portable electronic device, as described above, or via a user interface connected to a network. Typically, the arc flash protection boundary (AFPB) is included in the output, as defined by the distance from the potential arc source at which the incident energy exposure of 1.2 cal/cm$^2$ (5.02 J/cm$^2$). The output may also include an estimated IE exposure at a user-input distance D, and other data such as a hazard level, which in turn may indicate additional protective measures, including required personal protective equipment (PPE) for individuals working within the arc flash protection boundary.

12. NON-THERMAL HAZARDS

In addition to the risks of exposure the thermal energy, blast pressure, toxic gases and shrapnel can also pose a risk of serious injury in arc flash events. Blast pressures, for example, may cause permanent hearing loss, and intense light flashes can cause blindness. In the Attachment 5 of the Report provides one of the best assessments of non-thermal arc injuries.

In the 2005 NFPA/IEEE Report on Occupational Safety and Health Administration (OSHA) data, non-thermal injuries were reported in 7.3% of selected arc flash and electrical fault records. Injury records include flash burns and other eye injuries, temporary blindness, hearing loss, smoke inhalation, fractures, unconsciousness, lacerations and shrapnel injuries. These result from a variety of non-thermal effects, inclusion pressure and shock, sound, and light.

When an arc fault is initiated, hot gases expand rapidly in the vicinity of the arc source, creating a high-pressure front as the expanding gases compress the surrounding air. This generates a blast overpressure, with severity depending on the initial peak pressure, duration, distance, and degree of focusing due to enclosure and adjacent equipment or housings. Generally, blast overpressures may be greater for indoor arc flash events, for example in smaller enclosed rooms, where the pressure wave reflects from the floor, ceiling and walls.

Primary blast injuries due to the pressure wave itself include concussion, pulmonary and other internal injuries, and ear damage. Secondary injuries resulting from debris propelled by the blast include shrapnel wounds, lacerations, and secondary burns from hot metal droplets. These can occur anywhere on the body, but particularly include the eyes, head and hands. Tertiary injuries can result when the blast is strong enough to cause a fall, or even propel a body into an adjacent wall, nearby equipment, or other structure. Typically, energetic arc blast events include a range of such primary, secondary and tertiary risks, in addition to the substantial risk of burns due to thermal incident energy exposure, as described above.

Arc blast pressures can be measured using pressure gauges, pressure sensor pendulums, and high speed video tracking. Traditional direct pressure transducer-type sensor measurements may be challenging, however, due to the high magnetic flux and high temperature plasma gas generating during the arc flash event.

Both blast pressure and short-duration audio intensity can result in injuries to the ear, including hearing loss. The initial blast overpressure can cause lesions on the eardrum and internal ear structures, and may also dislocate or interrupt the chain of auditory ossicles or rupture fenestrae. Exposure to impulsive or impact noise levels of 140 dB or greater also pose a risk of injury, and personal protective equipment (PPE) categories based solely on (thermal) incident energy levels may not provide an effective measure of sound hazards.

Figure 12:
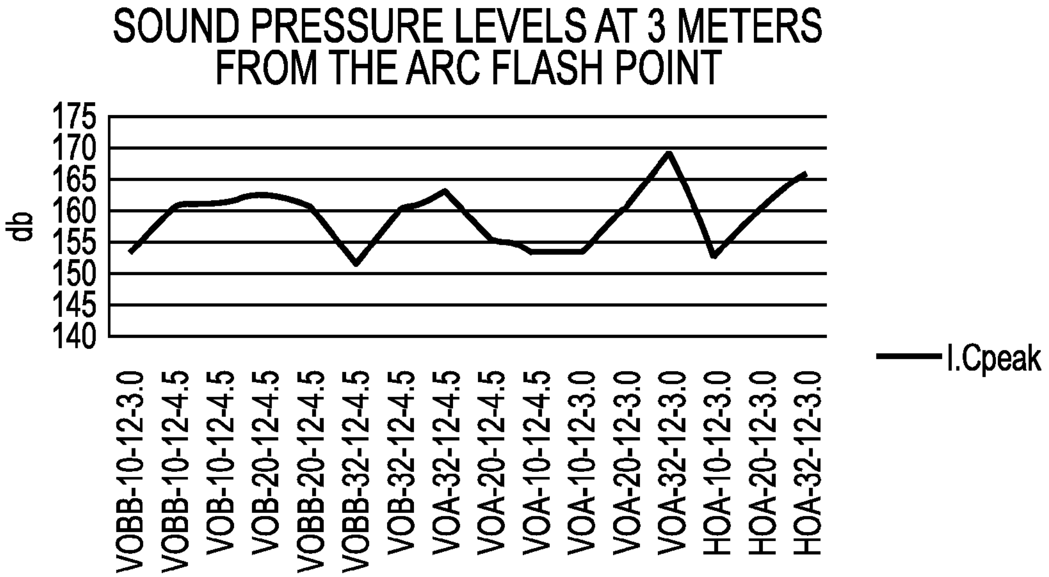
FIG. 12 is a plot of sound pressure levels measured at three meters from an arc flash.

FIG. 12 is a plot of sound pressure levels measured at three meters from the arc flash source, for a range of medium voltage class configurations, at 10 kA, 20 kA, and 32 kA bolted fault currents $I_{bf}$. These are twelve-cycle arc events, at 3 inch (76 mm) and 4.5 inch (114 mm) electrode gap spacing. Generally speaking, FIG. 12 indicates that peak sound intensities exceed 140 dB for a wide range of different arc flash configurations, and hearing protection may be indicated.

In addition to thermal energy including infrared (IR) radiation, arc flash events may also generate substantial light energy in the ultraviolet (UV) and visible range, for example between about 200 nm and about 600 nm. Depending on intensity, light exposure may result in flash blindness, which is a temporary loss of vision that can occur when the retina receives an excess of thermal energy, but less energy than required to cause a burn (which can result in permanent vision loss).

The recovery time from flash blindness depends on the flash size, intensity, direction, duration and energy spectrum, as well as the individual pupil size, age and other physical characteristics. Contributing factors are glare, afterimage formation and bleaching of the photochemical substances within the rods and cones, all of which can reduce the sensitivity of the retina.

Figure 13:
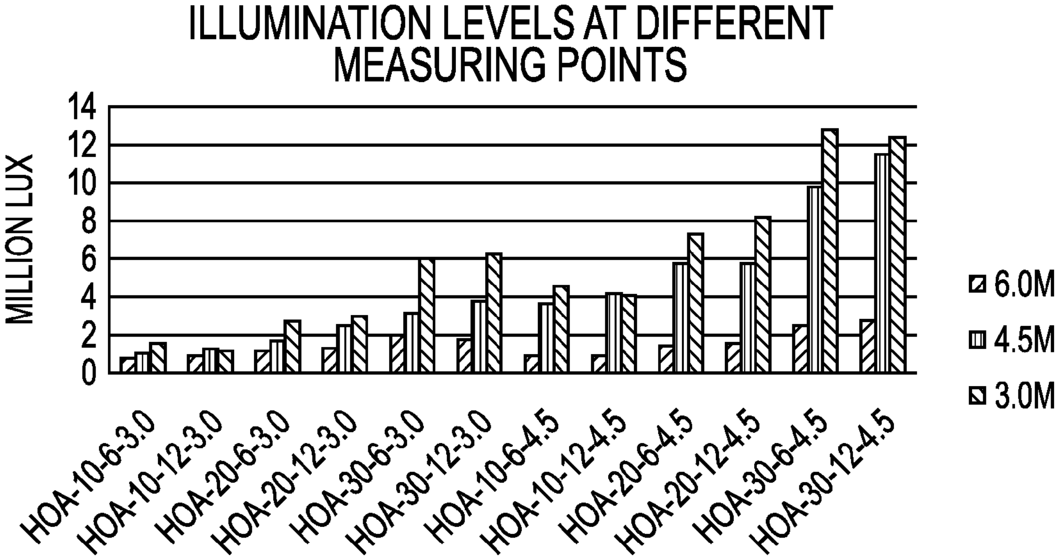
FIG. 13 is a plot of representative illumination measurements for arc flash events.

FIG. 13 is a plot of representative illumination measurements for arc flash events, taken across a range of medium voltage configurations at distances M of 3 m (about 910 ft), 4.5 m (about 15 ft), and 6 m (about 20 ft). A horizontal electrode, open air (HOA) configuration was used, with bolted fault currents $I_{bf}$ of 10 kA, 20 kA, and 32 kA, and gap widths G of 76.2 mm (3 inch) and 114.3 mm (4.5 inch), respectively. Spectrometers and light sensors are utilized to measure the illumination, typically in lux or lumen per square meter, with neutral density filters to attenuate light levels within the device ratings.

As shown in FIG. 13, light intensity increases with bolted fault current $I_{bf}$, and decrease with distance D. For these particular test configurations, larger electrode gap widths G may also significantly increase the observed illumination level. For comparison, a bright summer day may have a midday ground level illumination in the order of 100,000 lux, while the vertical axis is scaled in millions of lux. Thus, there is also a risk of injury due to arc flash illumination, in addition to the thermal, blast, and audio risks described above.

13. HAZARD ASSESSMENT MODEL

Based on the above, an empirically derived model is provided to enable arc flash hazard assessment, including calculation of arc flash parameters such as the arc current ($I_{arc}$), incident energy (IE), and arc flash protection boundary (or arc flash protection boundary distance). The model may be embodied in a computer-implemented method, using memory and processor components configured to perform the required calculations and assessment steps, with a suitable user interface for inputting data and reporting results. Alternatively, the arc flash hazard assessment may be embodied as a computer-implemented system, or as a computer software product with program code stored on a non-volatile computer readable medium, where the code is executable on a computer system to perform the desired method steps.

In one particular model, assessment values for the arc current ($I_{arc}$) are determined according to the parameters (or coefficients) in Table 6, assessment values for the incident energy (IE) are determined according to the parameters (or coefficients) in Table 7, and assessment values for the arc flash protection boundary are determined according to the parameters (or coefficients) in Table 8. The applicable ranges for these arc flash hazard assessments vary, depending on application.

In one particular set of models, the following parameter ranges are encompassed:

- Three-phase voltages in the range of about 208 V or less to about 15 kV or more.
- Bolted fault currents in the range of about 700 A or less to about 63 kA or more.
- Power cycle frequencies in the range of about 50 Hz or less to about 60 Hz or more.
- Electrode spacing and bus conductor gaps of about 0.25 inch (about 6 mm) or less to about six inches (about 152 mm) or more.
- Open air and enclosed circuit configurations with vertical, horizontal, and intermediate electrode orientations, in grounded and ungrounded examples.
- Enclosures with length, width, height and depth ranging from about six inches (about 150 mm) or less to about 36 inches (about 914 mm) or more.
- Working distances in the range of about 12-18 inches (about 300-450 mm) or less to about 48 inches (about 1.2 m) or more.

Based on the model analysis, arc current $I_{arc}$ can be calculated or estimated at different reference voltages $V_N$, for different electrode and enclosure configurations. In one such application, an are current model estimator equation may have the form:

$$I_{arc}(V_N)=A1_N+A2_N\times I_{bf}+A3_N\times G. \quad [15]$$

In this expression, $I_{arc}(V_N)$ is the model estimated arc current (in kA) for a given reference voltage $V_N$, in a particular electrode and enclosure configuration denoted as described above. Bolted fault current $I_{bf}$ is in kA, and electrode gap G is in mm.

TABLE 6

REPRESENTATIVE ARC CURRENT MODEL ESTIMATION PARAMETERS AND COEFFICIENTS - $I_{arc}$ (kA) -

| | 600 V | 2.7 kV | 14.3 kV |
|---|---|---|---|
| HCB | $I_{arc}$ = +1.883 (kA) +0.749 × $I_{bf}$ −0.036 × G | $I_{arc}$ = −0.168 (kA) +0.948 × $I_{bf}$ −0.001 × G | $I_{arc}$ = −0.828 (kA) +0.943 × $I_{bf}$ +0.011 × G |

TABLE 6-continued

| REPRESENTATIVE ARC CURRENT MODEL ESTIMATION PARAMETERS AND COEFFICIENTS - $I_{arc}$ (kA) - | | | |
|---|---|---|---|
| | 600 V | 2.7 kV | 14.3 kV |
| HOA | $I_{arc}$ = +2.465 (kA)<br>+0.716 × $I_{bf}$<br>−0.059 × G | $I_{arc}$ = +0.493 (kA)<br>+0.938 × $I_{bf}$<br>−0.007 × G | $I_{arc}$ = −0.172 (kA)<br>+0.941 × $I_{bf}$<br>+0.005 × G |
| VCB | $I_{arc}$ = +1.115 (kA)<br>+0.814 × $I_{bf}$<br>−0.031 × G | $I_{arc}$ = +0.3985 (kA)<br>+0.957 × $I_{bf}$<br>−0.008 × G | $I_{arc}$ = +0.290 (kA)<br>+0.947 × $I_{bf}$<br>−0.004 × G |
| VCBB | $I_{arc}$ = +1.237 (kA)<br>+0.819 × $I_{bf}$<br>−0.015 × G | $I_{arc}$ = +0.555 (kA)<br>+0.968 × $I_{bf}$<br>−0.012 × G | $I_{arc}$ = −1.042 (kA)<br>+0.960 × $I_{bf}$<br>+0.011 × G |
| VOA | $I_{arc}$ = +2.144 (kA)<br>+0.727 × $I_{bf}$<br>−0.073 × G | $I_{arc}$ = +0.489 (kA)<br>+0.956 × $I_{bf}$<br>−0.008 × G | $I_{arc}$ = +0.411 (kA)<br>+0.923 × $I_{bf}$<br>+0.002 × G |

These estimation parameters and coefficients are merely representative.
Values of the individual coefficients vary based on test data and modeling procedure, and the parametric form of the modeling equations may differ from application to application.

Representative parameters and corresponding coefficient values $A_N$, $B_N$ and $C_N$ are provided in Table 6, or each electrical equipment configuration. The particular dimensional units and conversion factors (e.g., kA and kA/mm) may assumed to be included with or subsumed into the coefficients, and are generally omitted for from the table for clarity. Note that the coefficients include both positive and negative terms, depending on voltage and arc source configuration. In addition, one or more of the various coefficients may be approximately zero, indicating little or substantially no functional dependent on a particular parameter, and other parameters may be included, depending on application.

The form of the incident energy estimation equation can sometimes be more complex, for example based on logarithmic scaling, with incident energy IE expressed in terms of energy exposure per cycle, $IE_{[cycle]}$. For example, the incident energy model equation may have the form:

$$\log(IE_{[cycle]})=B1_N+B2_N \times I_{ratio}+B3_N \log(I_{bf})+B4_{N,M} \log(G)+B5_{N,M} \log(D)+B6_{N,M} \log(I_{arc}) \quad [16]$$

In this expression, $\log(IE_{[cycle]})$ is the log (base 10) of the per-cycle model estimated incident energy function, in units of cal/cm$^2$, for a given reference voltage $V_N$ in the particular electrode and enclosure configuration denoted by index M. Representative modeling parameters and coefficient values $A1_{N,M}$, $A2_{N,M}$, $A3_{N,M}$, $A4_{N,M}$, $A5_{N,M}$ and $A6_{N,M}$ are provided in Table 7.

For the purposes of Table 7, bolted fault current $I_{bf}$ and arc current $I_{arc}$ may be expressed in kA, with dimensionless ratio. $I_R=I_{arc}/I_{bf}$. The electrode spacing or gap distance G and modeling point D (e.g., the distance to the electrode arc source) are both expressed in millimeters (mm). Note that the coefficients include positive, negative, and substantially zero terms, depending upon application, configuration, and test data used in the modeling. In other models, there may be more parameters, or fewer. Particular dimensional units and conversion factors (e.g., kA cal/cm$^2$, kA, m) are omitted for clarity, and may be assumed to be subsumed into the coefficients and parameters.

To complete the incident energy calculation, total incident energy IE is determined for the two closest reference voltages $V_N$. That is, $$IE=10^{\log IE_{[cycle]}} \times N_C. \quad [17]$$

In this expression, $N_C$ is the number of cycles and IE is the total incident energy exposure integrated over the duration of the arc flash event, as described above. The number of cycles ($N_C$) gives the time (t) required for a relay or other protective device to open, based on the arc current, or user input representing this quantity.

Where the incident energy is normalized to a particular box size, as described above, this can also be corrected for actual box dimensions, for example using a box size correction algorithm as described above with respect to FIGS. 10 and 11. A current-limiting fuse model can also be applied, for example to correct any one or more of the arc current, arc duration, or incident energy, based on fuse characteristics. Low voltage circuit breaker and fault current limiter corrections are also contemplated.

TABLE 7

| REPRESENTATIVE INCIDENT ENERGY MODEL ESTIMATION PARAMETERS AND COEFFICIENTS - $IE_{[cycle]}$ (cal/cm$^2$) - | | | |
|---|---|---|---|
| | 600 V | 2.7 kV | 14.3 kV |
| HCB | $\log IE_{[cycle]}$ = +4.904<br>−0.384 × $I_R$<br>+0.070 log G<br>−2.132 log D<br>+0.949 log $I_{arc}$ | $\log IE_{[cycle]}$ = +5.325<br>+0.171 × $I_R$<br>+0.364 log G<br>−2.574 log D<br>+1.003 log $I_{arc}$ | $\log IE_{[cycle]}$ = +3.372<br>+0.653 × $I_R$<br>+0.477 log G<br>−2.169 log D<br>+1.092 log $I_{arc}$ |
| HOA | $\log IE_{[cycle]}$ = +2.823<br>+0.201 × $I_R$<br>+0.521 log $I_{bf}$<br>+0.173 log G | $\log IE_{[cycle]}$ = +1.493<br>+1.321 × $I_R$<br>+0.683 log G<br>−1.976 log D | $\log IE_{[cycle]}$ = +2.396<br>+0.824 × $I_R$<br>+0.361 log G<br>−1.911 log D |

TABLE 7-continued

REPRESENTATIVE INCIDENT ENERGY MODEL ESTIMATION PARAMETERS AND COEFFICIENTS - $IE_{[cycle]}$ (cal/cm$^2$) -

| | 600 V | 2.7 kV | 14.3 kV |
|---|---|---|---|
| | −1.737 log D | +1.118 log $I_{arc}$ | +1.161 log $I_{arc}$ |
| | +0.507 log $I_{arc}$ | | |
| VCB | log $IE_{[cycle]}$ = +2.441 | log $IE_{[cycle]}$ = +6.971 | log $IE_{[cycle]}$ = +1.837 |
| | +0.995 × $I_R$ | −3.271 × $I_R$ | +0.378 × $I_R$ |
| | +0.780 log $I_{bf}$ | +0.157 log G | −0.032 log G |
| | +0.444 log G | −1.753 log D | −1.245 log D |
| | −1.895 log D | +0.966 log $I_{arc}$ | +0.829 log $I_{arc}$ |
| | +0.025 log $I_{arc}$ | | |
| VCBB | log $IE_{[cycle]}$ = −0.597 | log $IE_{[cycle]}$ = +3.464 | log $IE_{[cycle]}$ = +1.129 |
| | +1.974 × $I_R$ | +0.471 × $I_R$ | −0.734 × $I_R$ |
| | +0.780 log $I_{bf}$ | +0.452 log G | +1.167 log G |
| | +0.348 log G | −2.248 log D | −1.876 log D |
| | −1.552 log D | +1.255 log $I_{arc}$ | +1.200 log $I_{arc}$ |
| | +1.849 log $I_{arc}$ | | |
| VOA | log $IE_{[cycle]}$ = +3.321 | log $IE_{[cycle]}$ = −2.133 | log $IE_{[cycle]}$ = +2.204 |
| | −0.449 × $I_R$ | +4.702 × $I_R$ | −0.309 × $I_R$ |
| | +0.054 log G | +0.414 log G | +0.204 log G |
| | −1.778 log D | −1.826 log D | −1.501 log D |
| | +1.059 log $I_{arc}$ | +1.285 log $I_{arc}$ | +1.183 log $I_{arc}$ |

These estimation parameters and coefficients are merely representative.

Values of the individual coefficients vary based on test data and modeling procedure, and the parametric form of the modeling equations may differ from application to application.

The arc flash protection boundary (AFPB) can be estimated based on the distance at which the predicted total incident energy IE yields an estimated exposure of 1.2 cal/cm$^2$, given the arc current $I_{arc}$ and arc energy $E_{arc}$. To determine the arc flash protection boundary, that is, the incident energy is defined to be IE=1.2 cal/cm$^2$, and the incident energy estimator equation can be solved for arc flash protection boundary distance Db, as defined by the D corresponding to the IE value. The arc flash protection boundary is based on a total exposure incident energy (IE) value, integrated over the cycle time of the arc flash event, at the given arc flash protection boundary distance Db.

TABLE 8

REPRESENTATIVE ARC FLASH PROTECTION BOUNDARY MODEL ESTIMATION PARAMETERS AND COEFFICIENTS - Db (mm), at IE = 1.2 cal/cm$^2$ -

| | 600 V | 2.7 kV | 14.3 kV |
|---|---|---|---|
| HCB | log Db = +4.904 | log Db = +5.325 | log Db = +3.372 |
| | −0.384 × $I_R$ | +0.171 × $I_R$ | +0.653 × $I_R$ |
| | +0.070 log G | +0.364 log G | +0.477 log G |
| | +0.949 log $I_{arc}$ | +1.003 log $I_{arc}$ | +1.092 log $I_{arc}$ |
| | −log(1.2/$N_C$)/2.132 | −log(1.2/$N_C$)/2.574 | −log(1.2/$N_C$)/2.169 |
| HOA | log Db = +2.823 | log Db = +1.493 | log Db = +2.396 |
| | +0.201 × $I_R$ | +1.321 × $I_R$ | +0.824 × $I_R$ |
| | +0.521 log $I_{bf}$ | +0.683 log G | +0.361 log G |
| | +0.173 log G | +1.118 log $I_{arc}$ | +1.161 log $I_{arc}$ |
| | +0.507 log $I_{arc}$ | −log(1.2/$N_C$)/1.967 | −log(1.2/$N_C$)/1.911 |
| | −log(1.2/$N_C$)/1.737 | | |
| VCB | log Db = +2.441 | log Db = +6.971 | log Db = +1.837 |
| | +0.995 × $I_R$ | −3.271 × $I_R$ | +0.378 × $I_R$ |
| | +0.780 log $I_{bf}$ | −0.157 log G | −0.032 log G |
| | +0.444 log G | +0.966 log $I_{arc}$ | +0.829 log $I_{arc}$ |
| | +0.025 log $I_{arc}$ | −log(1.2/$N_C$)/1.753 | −log(1.2/$N_C$)/1.245 |
| | −log(1.2/$N_C$)/1.895 | | |
| VCBB | log Db = −0.597 | log Db = +3.464 | log Db = +1.129 |
| | +1.974 × $I_R$ | +0.417 × $I_R$ | −0.734 × $I_R$ |
| | +0.348 log G | +0.452 log G | +1.676 log G |
| | +1.849 log $I_{arc}$ | +1.255 log $I_{arc}$ | +1.200 log $I_{arc}$ |
| | −log(1.2/$N_C$)/1.552 | −log(1.2/$N_C$)/2.248 | −log(1.2/$N_C$)/1.876 |
| VOA | log Db = +3.321 | log Db = −2.133 | log Db = +2.204 |
| | −0.449 × $I_R$ | +4.702 × $I_R$ | −0.309 × $I_R$ |
| | +0.054 log G | +0.414 log G | +0.204 log G |
| | +1.059 log $I_{arc}$ | +1.285 log $I_{arc}$ | +1.183 log $I_{arc}$ |
| | −log(1.2/$N_C$)/1.778 | −log(1.2/$N_C$)/1.826 | −log(1.2/$N_C$)/1.501 |

These estimation parameters and coefficients are merely representative.

Values of the individual coefficients vary based on test data and modeling procedure, and the parametric form of the modeling equations may differ from application to application.

Alternatively, the arc flash protection boundary can be modeled using a series of reference voltages $V_N$, as described above for arc current $I_{arc}$ and incident energy per cycle $IE_{[cycle]}$. In this approach, the arc flash protection boundary model estimator function may also take a logarithmic form, for example:

$$\log(D0)=C1_{N,M}+C2_{N,M}\times I_{ratio}+C3_{N,M}\ \log(I_{bf})+C4_{N,M}\ \log(G)+C5_{N,M}\ \log(I_{arc})+\log(1.2/N_C)/C6_{N,M}. \quad [18]$$

In this expression, log(Db) is the log (base 10) of the modeled or estimated arc flash protection boundary distance Db, measured in mm, for a given reference voltage $V_N$ and a particular electrode and enclosure configuration denoted by index M. Representative parameters and corresponding coefficient values $C1_{N,M}$, $C2_{N,M}$, $C3_{N,M}$, $C4_{N,M}$, $C5_{N,M}$ and $C6_{N,M}$ are provided in Table 8. Again, the particular dimensional units and conversion factors (e.g., cal/cm$^2$, kA and mm) are omitted for clarity, and the coefficients may include positive, negative and substantially zero terms, based on model and testing data.

Taken together, Tables 6-8 and Equations 15-18 represent one particular example of arc flash assessment model. More generally, the estimation parameters and coefficients are merely representative. In particular, the coefficient values vary based on test data and modeling procedure, and the parametric forms of the modeling equations differ from application to application. In addition, similar models can also be generated for other reference voltages, including, but not limited to, 208 V and 480 V.

14. MODEL APPLICATION AND ESTIMATION

Figure 14:
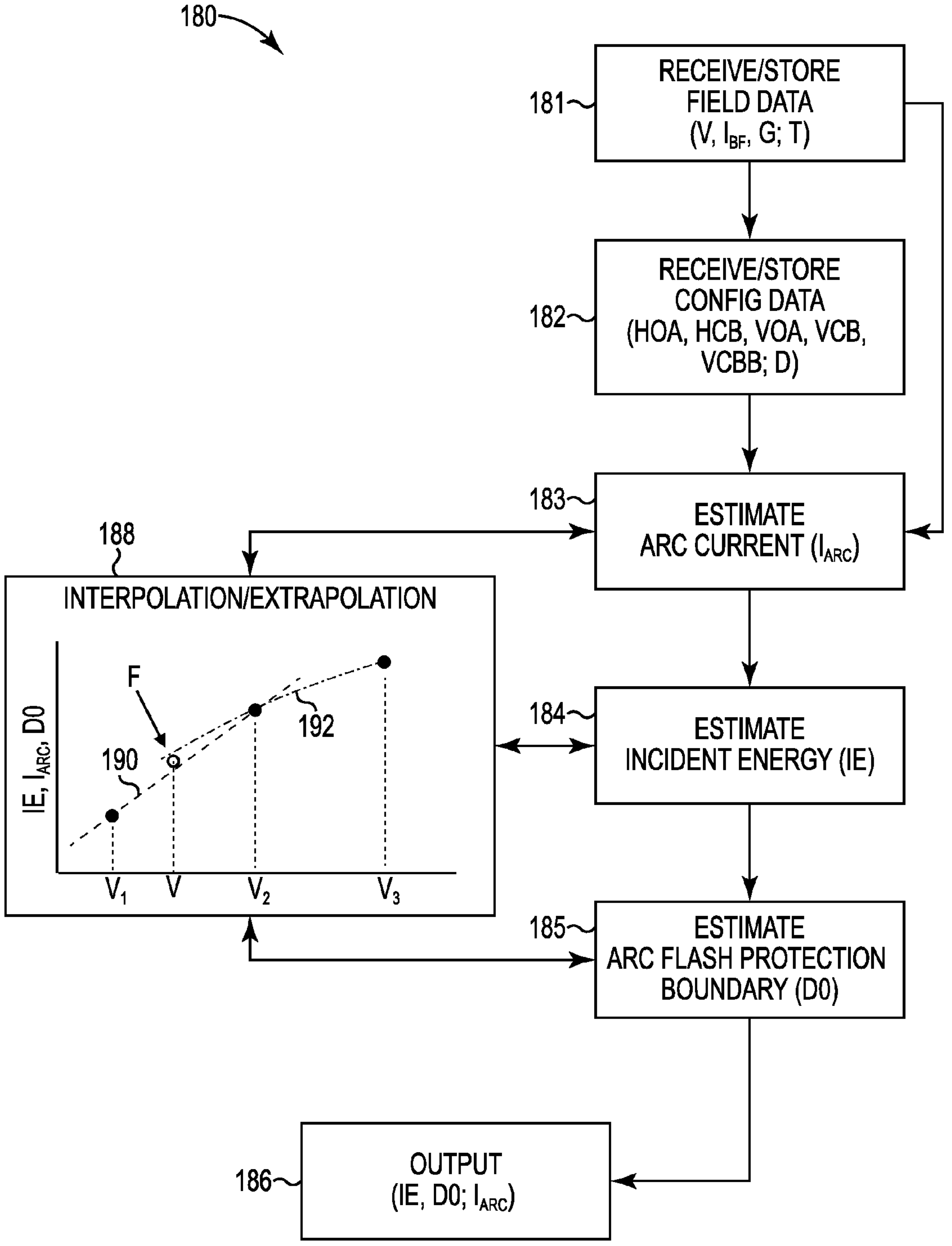
FIG. 14 is a block diagram illustrating an application of an arc flash model to assess an arc flash hazard.

FIG. 14 is a block diagram illustrating method 180 for application of an arc flash model to assess a particular arc flash hazard. In this application, method 180 includes one or more steps of receiving electrical equipment and configuration data (steps 181 and 182), estimating the arc fault current (step 183), estimating the incident energy (step 184), estimating the arc flash protection boundary (step 185), and generating output (step 186) for arc flash hazard assessment. In addition, any one or more of estimating step 183 for arc flash $I_{arc}$, estimating step 184 for incident energy IE, and estimating step 185 for arc flash protection boundary Db may include interpolation and extrapolation (step 188), for example based on three or more reference voltages $V_{N-1}$, $V_N$, and $V_{N+1}$, as described below.

Receiving data (step 181) may include receiving and storing in memory user or field data describing an electrical apparatus or equipment that is a potential arc fault hazard. The field or system data may include any one or more of an operating voltage V, a bolted fault current $I_{bf}$, an electrode gap G, and an arc duration or fault clearing time (t).

Field data are acquired in a number of ways, as known in the art. For example, operating voltage ratings are typically defined on particular equipment, and the electrode spacing may be measured or defined base on voltage class and equipment configuration (see, e.g., Table 9, below). Circuit diagrams, short circuit studies, and short circuit programs are available for calculating the symmetrical root-mean-square (RMS) bolted fault current on a variety of different electrical equipment and bus configurations.

Available bolted fault currents should be determined as accurately as possible for best results, including all relevant cabling. In particular, the analysis is typically performed for arc flash hazard locations, where individuals may be located and where workers perform maintenance or other tasks on the system. It is not necessarily conservative to overestimate the fault current, moreover, because this may result in a shorter predicted release time than would actually be the case, and thus actually decrease rather than increase the incident energy estimate.

In typical applications, the arc duration time (t) is a nominal user-supplied value, but in advanced implementations for locations energized by multiple feeders, the portion of the total arc current passing through a number of different protective devices may be determined, in order to determine the clearing time for each individual device. In particular, the total arc fault current at the point of concern and the portion of that current passing through the first upstream protective device may each be defined, in order to determine the arc duration or time (t) for use in the incident energy estimation (step 184). Fuse, circuit breaker, and relay-operated system characteristics may also be considered.

Receiving configuration data (step 182) may include receiving and storing in memory data describing various possible configurations of the electrical equipment, for example vertical open-air (VOA), horizontal open air (HOA), vertical enclosed (VCB), horizontal enclosed (HCB), and enclosed barrier configurations (VCBB). Typically these configuration include an enclosure state (e.g, enclosed or open-air), and an electrode orientation (e.g., vertical or horizontal), and a barrier status (e.g., present or absent). An enclosure dimension may also be provided (e.g., one or more of length, width, and height), as well as a working distance (D), as defined from the potential arc source.

Typically, field parameters including bus or electrode gap G and working distance D may be related to the voltage class and configuration. For example, in 5 kV and 15 kV switchgear applications, the typical bus gaps G and working distances D are higher than in low voltage system switchgear and other lower-voltage systems, as shown in Table 9. These parameter values, however, are merely representative, and the values may vary from system to system.

TABLE 9

EQUIPMENT CLASSES (REPRESENTATIVE FIELD PARAMETERS)

| Equipment Class | Typical Gap G (in/mm) | Typical Working Distance D (mm) |
|---|---|---|
| 15 kV switchgear | 6 in/153 mm | 36 in/910 mm |
| 5 kV switchgear | 4 in/104 mm | 36 in/910 mm |
| Low-voltage switchgear | 1.25 in/32 mm | 24 in/610 mm |
| Low-voltage MCC | 1 in/25 mm | 18 in/455 mm |
| Low-voltage panelboard | | |
| Cable | 0.5 in/13 mm | 18 in/455 mm |

The configuration definitions depend upon the enclosure geometry, and in particular the orientation of the terminals with respect to workers and other nearby personnel. This is because electrical arcs can be driven along the electrodes by magnetic effects, as described above, and the incident energy model depends strongly on whether the estimation point is along the potential path. Enclosures also tend to redirect plasma energy toward the worker, which also increases thermal exposure.

Table 10 provides a representative listing of equipment configurations and relevant electrode characteristics. As shown in Table 10, one relevant question for a horizontal configuration or electrode orientation, as defined herein, is whether the conductors extend toward locations where employees, contractors or other personnel might by when working on the system. Thus, the definition of horizontal and vertical configuration may be considered a relative definition, as define by worker location, as well as an absolute definition based on vertical and horizontal orientations with respect to the floor or other working surface.

TABLE 10

TYPICAL EQUIPMENT CONFIGURATIONS - REPRESENTATIVE ELECTRODE ORIENTATION AND TERMINATION -

| Configuration | Electrode Orientation | Enclosure | Electrode Termination |
|---|---|---|---|
| VCB | Vertical | Enclosed | None, or a tap in a bus run - arc flash will likely run to end of bus, away from supply |
| VCBB | Vertical | Enclosed | Terminated in a barrier such as the lug on a CB - arc flash will remain at barrier |
| HCB | Horizontal | Enclosed | None - conductors extend toward locations where worker might stand |
| VOA | Vertical | Open Air | None - same as VCB |
| HOA | Horizontal | Open Air | None - same as HCB |

Estimating the arc current (step 183) may be accomplished using an arc current estimator or model, as described herein. Typically, arc current $I_{arc}$ may be lower than bolted fault current $I_{bf}$ due to arc impedance. For relatively low operating voltages of about 1000 V or less, two different arc current values may be utilized, with two different corresponding arc durations, for example with a secondary arc current defined at about 85% of the primary arc current. Alternatively, a modified arc current may be utilized, for example a user-supplied or operator value.

More generally, the arc fault current may depend on a number of system parameters including the bolted fault current $I_{bf}$, arc gap G and operating voltage V. Based on these parameters, an arc current estimator equation may be generated based on test data, with different coefficients $A1_{N,M}$, $A2_{N,M}$ and $A3_{N,M}$ for different reference voltages N and system configurations M, for example as shown in Table 6.0. Using these parameters, nominal values for arc current $I_{arc}$ may be defined or determined at a number of reference voltages $V_N$, and the arc current at a particular operating voltage V may be determined based on a combination of interpolation, extrapolation, and other curve fitting procedures, as described herein.

Estimating the incident energy (step 184) may be accomplished using an arc current estimator or model equation, as described herein. Typically, incident energy IE is total value, integrated over an arc fault time (t) and defined at a particular distance D, as described above. For a given configuration and operating voltage V, the incident energy can be determined by a combination of extrapolation and interpolation (step 188), as described below.

Estimating the arc flash protection boundary (step 185) can be performed by setting the incident energy equation to 1.2 cal/cm$^2$ and solving for distance D=Db, for example at a particular reference voltage $V_N$ where the IE model estimator equations are well defined. More generally, arc flash protection boundary Db can be determined based on extrapolation and interpolation (step 188).

At step 186, output is generated for arc flash hazard assessment. The output may include the arc flash hazard boundary Db, as well as an estimated value for incident energy IE at a particular (e.g, user-defined) working distance D. The incident energy can also be used to define a risk category for the hazard (e.g., on a scale of 0 to 4 based on incident energy IE, or other industry standard scale). The risk factor, in turn, can be utilized to determine a minimum personal protective equipment (PPE) rating applicable to personnel working on the electrical equipment, at the working distance D. In addition, barriers, markings, and other steps may be taken to exclude unprotected personnel from the arc flash protection boundary area (or, more typically, from within a distance of at least a few or several times Db).

Extrapolation and interpolation (step 188) allows particular arc current ($I_{arc}$), incident energy (IE), and arc flash protection boundary (Db) values to be determined for a range of different voltages spanned by different voltage reference values $V_N$. For example, at least three different reference voltages $V_{N-1}$, $V_N$ and $V_{N+1}$ can be selected from a set of predetermined reference voltage values, for example 208 V, 480 V, 600 V, 2.7 kV, and 14.3 kV. Alternatively, arbitrary reference voltages $V_N$ may be used.

The interpolation and extrapolation procedure is illustrated schematically in step 188 of method 180. For example, the arc current $I_{arc}$, incident energy IE, or arc flash protection boundary Db may be modeled at a particular point P for voltage V between two reference voltages $V_{N-1}$ (first reference point $V_1$) and $V_N$ (second reference point $V_2$), with a third reference voltage $V_{N+1}$ (reference point $V_3$), ordered such that:

$$V_{N-1} \le V \le V_N \le V_{N+1} \quad [19]$$

Rather than taking an interpolation 190 between first and second points reference points $V_1$ and $V_2$, however, a combined interpolation and extrapolation procedure is used, based on all three reference voltages $V_1$, $V_2$, and $V_3$. The extrapolation and interpolation results are then weighted, in order to find a final estimation for the desired parameter (function F) at voltage V.

For example, an interpolation 190 may be used between first and second points $V_1$ and $V_2$, with a particular interpolated value $F_{[int]}$ at voltage V, based on the weighted average of interpolation endpoints $V_1$ and $V_2$. In addition, extrapolation 192 is extended from second and third reference points $V_2$ and $V_3$, yielding a (generally different) extrapolated value $F_{[ext]}$, at the same voltage V. Each of interpolation 190 and extrapolation 192 may be linear, as described above, or one or both may have a second order (or other higher order) non-linear form, as shown in FIG. 14.

Then, the estimated value of function F is determined by a weighted average of interpolated value $F_{[int]}$ and extrapolated value $F_{[ext]}$. The weighting may also be linear, for example based on:

$$F = \frac{V_2 - V}{V_2 - V_1} F_{[int]} + \frac{V - V_1}{V_2 - V_1} F_{[ext]}. \quad [20]$$

In this expression, interpolated value $F_{[int]}$ is used at first reference point $V=V_1$, and extrapolated value $F_{[ext]}$ is used at second reference point $V=V_2$, with linear weighting in the region $V_1 \le V \le V_2$ based on the fractional distance $(V-V_{1+})/(V_2-V_1)$. Alternatively, non-linear weighting may be used.

Between reference voltages $V_2$ and $V_3$, the interpolated value may be used, either alone or in combination with an extrapolated value based on reference voltages $V_1$ and $V_2$. For example, for references $V_1$=600 V, $V_2$=2.7 kV, and $V_3$=14.3 kV, the higher-voltage region $V_2 \le V \le V_3$ may exhibit more stable arcing and more reliable data, and only the interpolated value $F_{[int]}$ may be used. Alternatively, a number of relatively lower-voltage reference points $V_1$=208 V, $V_2$=480 V, and $V_3$=600 V may be defined, and a combination of interpolation and extrapolation may be used throughout the region of interest.

The extrapolated values $F_{[ext]}$, moreover, are not limited to any particular basis in reference points $V_1$, $V_2$, and $V_3$, but may also include additional reference voltages $V_4$, $V_5$, etc., for example an extrapolation based on references $V_3$=600 V and $V_4$=2.7 kV, or based on $V_4$=2.7 kV and $V_5$=14.3 kV. In additional examples, extrapolations $F_{[ext]}$ from a lower-voltage reference pair such as $(V_{N-1},V_N)$ may be used in combination with interpolations $F_{[int]}$ for a higher-voltage reference pair such as ($V_N$, Vn+1), where the ordering is:

$$V_{N-1} \leq V_N \leq V \leq V_{N+1}. \quad [21]$$

Figure 15:
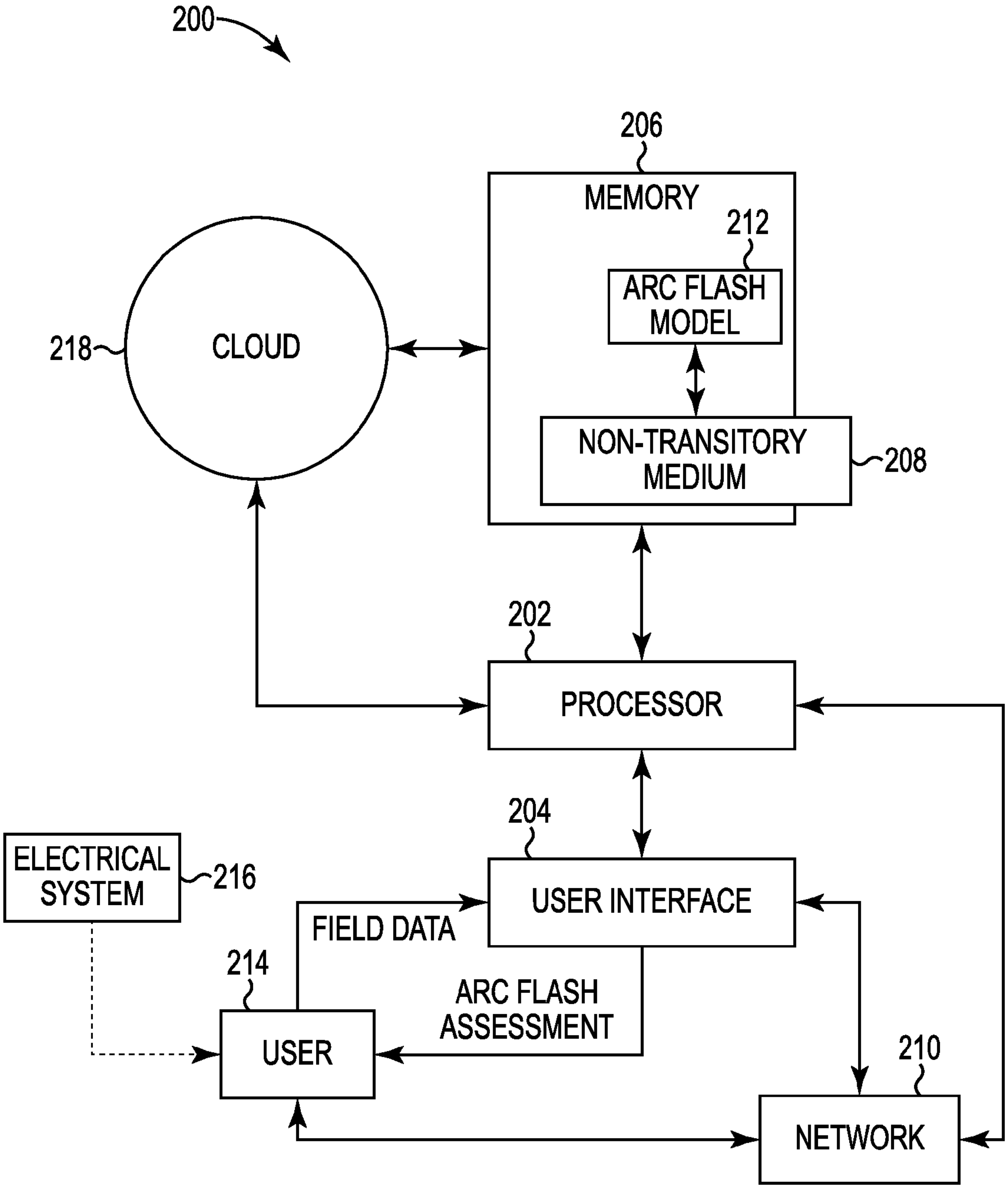
FIG. 15 is a schematic diagram of a representative computer-based system for arc flash hazard assessment.

FIG. 15 is a schematic diagram of a representative computer-based system 200 for arc flash hazard assessment. As shown in FIG. 15, system 200 includes computer-based processor 202, graphical or other user interface 204, and memory 206 with non-volatile machine-readable storage medium 208.

System 200 may comprise a portable or desktop computer, a tablet computer, a smartphone or mobile device, or other computer-based processing system. Processor 202, user interface 204, and memory 206 are coupled in signal communication, for example utilizing hardware connections, or over a network 210.

Processor 202 is configured to perform a method of arc flash modeling and assessment including, but not limited to, any one or more of method steps 181-186 and 188 of method 180, as described above. For example, memory 206 may be configured to store model parameters, coefficients, and other arc flash model data 212, and non-transitory machine-readable storage medium 208 may store program code executable by processor 202 to perform the modeling method, with input and output via user interface 204. User interface 204 may be operated by user 214, in order to enter field data representing electrical equipment or apparatus 216, and to receive arc flash output for assessing a corresponding arc flash hazard.

In network-based applications of computer system 200, processor 202 may be physically separate from user interface 204, with communicative coupling provided over a network 210, for example an internet system, local network, or wireless network, or a combination thereof. In such applications, memory 206 may comprise data storage elements local to either processor 202 or user interface 204, or a cloud-based data storage system accessible via cloud-based network components 218. Alternatively, computer-based system 200 may be provided substantially as a physical unit, for example in stand-alone computer system form, or as a smartphone, tablet computer, or other hand-held device.

While this invention has been described with reference to exemplary embodiments, it will be understood by those skilled in the art that various changes can be made and equivalents may be substituted for elements thereof, without departing from the spirit and scope of the invention. In addition, modifications may be made to adapt the teachings of the invention to particular situations and materials, without departing from the essential scope thereof. Thus, the invention is not limited, and is not intended to be limited, to the particular examples that are disclosed herein, but encompasses all embodiments falling within the scope of the appended claims.

The invention claimed is:

1. An improved computer-implemented method of arc flash hazard assessment for electrical equipment, the method comprising:

storing field data in memory, the field data comprising at least an operating voltage, a fault current, and a fault clearing time for an arc flash source in the electrical equipment; and with a computer processing system in signal communication with the memory:

defining an arc flash assessment model for an arc flash at the arc flash source based on the field data, the arc flash assessment model including an incident energy determined for at least first, second and third reference voltages;

interpolating the incident energy between the first and second reference voltages to define an interpolated value at the operating voltage;

extrapolating the incident energy from the second and third reference voltages to define an extrapolated value at the operating voltage; and estimating a value of the incident energy at a working distance from the arc flash source, based on a weighted average of the interpolated and extrapolated values; and outputting the estimated value of the incident energy to a user interface operable by a user to enter the field data representing the electrical equipment and to receive arc flash output comprising the estimated value of the incident energy for assessing the corresponding arc flash hazard at the working distance from the arc flash source.

2. The method of claim 1, further comprising outputting an arc flash protection boundary to the user interface, wherein the estimated value of the incident energy function has a predefined value of about 1.2 cal/cm$^2$ (about 5.02 J/cm$^2$) for a working distance defined at the arc flash protection boundary.

3. The method of claim 1, further comprising receiving the field data via the user interface.

4. The method of claim 3, wherein the field data include an electrode gap of the arc flash source.

5. The method of claim 4, wherein the electrode gap defines a separation between at least two three-phase electrodes of the arc flash source, and wherein the arc flash assessment model represents an arc flash event in which plasma energy is ejected from the electrodes, at the electrode gap.

6. The method of claim 4, wherein the arc flash assessment model includes an arc current determined for at least the first, second and third reference voltages based on the fault current and the gap, and further comprising outputting to the user interface an estimated value of the arc current at the operating voltage.

7. The method of claim 6, wherein the estimated value of the arc current is obtained by a weighted average of interpolation at the operating voltage between the first and second reference voltages and extrapolation to the operating voltage from the second and third reference voltages.

8. The method of claim 6, wherein the fault clearing time for the electrical equipment depends on the estimated value of the arc current.

9. The method of claim 4, wherein the field data comprise configuration data for the arc flash source and the incident energy is determined at the first, second and third reference voltages in dependence on the configuration data.

10. The method of claim 9, wherein the configuration data describe a horizontal or vertical orientation of the arc flash source with respect to a working position on the electrical equipment, such that the estimated value of the incident energy depends upon the orientation.

11. The method of claim 9, wherein the configuration data describe an enclosure state of the arc flash source, such that the estimated value of the incident energy depends upon the enclosure state.

12. The method of claim 11, wherein the enclosure state comprises an enclosure dimension and further comprising scaling the incident energy according to the enclosure dimension.

13. The method of claim 1, wherein the arc flash assessment model further comprises an arc flash protection boundary determined for at least the first, second and third reference voltages and further comprising outputting to the user interface an estimated value of the arc flash protection boundary at the operating voltage, based on a weighted average of interpolation at the operating voltage between the first and second reference voltages and extrapolation to the operating voltage from the second and third reference voltages.

14. The method of claim 1, wherein interpolating the incident energy comprises linear interpolation of the incident energy to the operating voltage between the first and second reference voltages, and wherein extrapolation of the incident energy comprises linear extrapolation of the incident energy from the second and third reference voltages to the operating voltage between the first and second reference voltages.

15. The method of claim 14, wherein estimating the incident energy at the operating voltage comprises linear weighting of the interpolated and extrapolated values based on a position of the operating voltage between the first and second reference voltages.

16. The method of claim 1, wherein the reference voltages are ordered such that the first reference voltage is less than the second reference voltage and the second reference voltage is less than the third reference voltage, and wherein the operating voltage is between the first and second reference voltages.

17. The method of claim 16, wherein the first reference voltage is approximately 600 V, the second reference voltage is approximately 2.7 kV, and the third reference voltage is approximately 14.3 kV.

18. The method of claim 17, wherein the reference voltages further comprise at least one of a fourth reference voltage of approximately 480 V and a fifth reference voltage of approximately 208 V.

19. The method of claim 1, wherein the incident energy is determined from arc flash test data for at least the first, second and third reference voltages and the arc flash data are obtained from test configurations including both open air and enclosed electrode configurations and both horizontal and vertical electrode orientations relative to an arc flash test array.

20. An improved arc flash hazard assessment system for an electrical apparatus, the system comprising:

memory for storing input data describing at least an operating voltage, a fault current, and a fault clearing time for an arc flash source in the electrical apparatus;

a processor in communication with the memory, the processor configured to define an arc flash assessment model based on the input data, wherein the arc flash assessment model is defined for at least first, second and third reference voltages, wherein the first reference voltage is less than the second reference voltage and the second reference voltage is less than the third reference voltage; and a user interface operable by a user to enter field data representing the electrical apparatus and to receive arc flash output for assessing the corresponding arc flash hazard, the user interface configured to output an arc flash assessment for the electrical apparatus based on an estimated value of the arc flash assessment model at the operating voltage, wherein the arc flash assessment model defines incident energy at a working distance from an arc flash event at the arc flash source, the estimated value comprising a weighted mean of:

an interpolated value defined by interpolation of the arc flash assessment model at the operating voltage between the first and second reference voltages; and an extrapolated value defined by extrapolation of the arc flash assessment model from reference voltages $V_2$ and $V_3$ to the operating voltage.

21. The system of claim 20, wherein the arc flash assessment model defines incident energy and the arc flash assessment describes an estimated value of the incident energy at the working distance from an arc flash event at the arc flash source.

22. The system of claim 21, wherein the arc flash assessment further describes an arc flash protection boundary based on the estimated value of the incident energy having a predefined value of about 1.2 cal/cm$^2$ (about 5.02 J/cm$^2$) or less at the working distance.

23. The system of claim 22, wherein the interpolated and extrapolated values of the arc flash assessment model are defined by linear interpolation and linear extrapolation, respectively, and wherein the weighted mean is linearly weighted based on a position of the operating voltage between the first and second reference voltages.

24. The system of claim 20, wherein the first, second and third reference voltages are selected from a group consisting of approximately 208 V, approximately 480 V, approximately 600 V, approximately 2.7 kV, and approximately 14.3 kV.

25. The system of claim 20, wherein the first, second and third reference voltages are selected from a group consisting of approximately 600 V, approximately 2.7 kV, and approximately 14.3 kV.

26. The system of claim 20, wherein the input data include configuration data describing an enclosure state and orientation of the arc flash source, and wherein the arc flash assessment model is defined for the first, second and third reference voltages in dependence on the configuration data.

27. The system of claim 26, wherein the arc flash assessment model defines an arc flash protection boundary for an arc flash event at the arc flash source, and wherein the arc flash assessment describes an estimated value of the arc flash protection boundary based on the operating voltage and the configuration data.

28. The system of claim 27, wherein plasma energy is ejected from the arc flash source by electromagnetic effect in the arc flash event, such that the estimated value of the arc flash protection boundary depends upon the orientation of the electrodes with respect to a working position defined for the electrical apparatus.

29. The system of claim 27, wherein the incident energy is determined from arc flash test data for at least the first, second and third reference voltages, the arc flash test data obtained with open air and enclosed electrode configurations having horizontal and vertical orientations with respect to a calorimeter array.

30. The system of claim 20, wherein the input data describe an electrode gap of the arc flash source and the arc flash assessment model defines an arc current in an arc flash event at the arc flash source, based on the fault current and the electrode gap.

31. The system of claim 30, wherein the arc flash assessment includes an estimated value of the arc current in the arc flash event.

32. The system of claim 31, wherein the fault clearing time of the electrical apparatus depends at least in part on the estimated value of the arc current.

33. A non-transitory computer-readable storage medium having program code thereon, the program code executable by a processor to perform an improved method of arc flash assessment for electrical equipment, the improved method comprising:

storing field data in memory, the field data describing at least an operating voltage, a bolted fault current $I_{bf}$, and a fault clearing time of the electrical equipment; and defining an arc flash assessment model based on the field data, the arc flash assessment model including an incident energy determined for at least first, second and third reference voltages, wherein the first reference voltage is less than the second reference voltage and the second reference voltage is less that the third reference voltage;

interpolating the incident energy between reference the first and second reference voltages to define an interpolated value at an operating voltage;

extrapolating the incident energy from the first reference voltage through the second reference voltage to define an extrapolated value at the operating voltage;

estimating the incident energy at a working distance from the arc flash source, based on a weighted average of the interpolated and extrapolated values;

determining an arc flash protection boundary with respect to the arc flash source, wherein the estimated incident energy has a predefined value at the arc flash protection boundary; and outputting an arc flash assessment to a user interface operable by a user to enter the field data describing the electrical equipment and to receive arc flash output for assessing the corresponding arc flash hazard, the arc flash assessment describing the arc flash protection boundary and the estimated incident energy at the working distance from the arc flash source.

34. The medium of claim 33, wherein the predefined value of the estimated incident energy is about 1.2 cal/cm$^2$ (about 5.02 J/cm$^2$) or less at the arc flash protection boundary.

35. The medium of claim 33, wherein the field data describe an electrode gap G of the arc flash source.

36. The medium of claim 35, wherein the arc flash assessment model includes an arc current based on the bolted fault current $I_{bf}$ and the electrode gap G, wherein the arc current is determined for at least the first, second and third reference voltages.

37. The medium of claim 36, the method further comprising estimating the arc current at the operating voltage by interpolation between the first and second reference voltages and extrapolation from the second and third reference voltages, and further comprising outputting the estimated arc current to the user interface.

38. The medium of claim 37, the method further comprising receiving the field data describing the fault clearing time from the use interface, in dependence upon the estimated value of the arc current at the operating voltage.

39. The medium of claim 33, wherein the field data describe a horizontal or vertical electrode orientation of the arc flash source with respect to a working position, the method further comprising determining the incident energy at the first, second and third reference voltages in dependence on the orientation.

40. The medium of claim 39, wherein the field data further describe an enclosure configuration of the arc flash source, the method further comprising determining the incident energy at the first, second and third reference voltages in dependence on the enclosure configuration.

41. The medium of claim 40, wherein the arc flash assessment model is defined to model an arc flash event in which plasma, thermal energy and electrode material are ejected from the arc flash source, such that the arc flash protection boundary and the estimated incident energy each depend upon the orientation of the electrodes with respect to the working position.

42. The medium of claim 33, wherein the first, second and third reference voltages are selected from approximately 208 V, approximately 480 V, approximately 600 V, approximately 2.7 kV, and approximately 14.3 kV.

43. The medium of claim 33, wherein the incident energy is determined from arc flash test data for at least the first, second and third reference voltages, the arc flash test data obtained with open air, enclosed, horizontal and vertical electrode configurations.

* * * * *

UNITED STATES PATENT AND TRADEMARK OFFICE
CERTIFICATE OF CORRECTION

PATENT NO. : 9,146,267 B2
APPLICATION NO. : 13/793488
DATED : September 29, 2015
INVENTOR(S) : Wei-Jen Lee et al.

It is certified that error appears in the above-identified patent and that said Letters Patent is hereby corrected as shown below:

SPECIFICATION

| Column | Line | PTO | Should Read |
|---|---|---|---|
| 3 | 64 | "2005). --R. H. Lee," | -- 2005).<br>R. H. Lee, -- |
| 4 | 67 | "$D_{[box]}$=[(t/$E_{[box]}$)" | -- $D_{[box]}$=[(t/$IE_{[box]}$) -- |
| 6 | 23 | "calorimeter distance: 305" | -- Calorimeter distance: 305 -- |
| 8 | 9 | "Are flash may result" | -- Arc flash may result -- |
| 18 | 26 | "600 V, 20 kA (VGA)" | -- 600 V, 20 kA (VOA) -- |
| 18 | 26 | "2.7 kV, 20 kA (VGA)" | -- 600 V, 20 kA (VOA) -- |
| 18 | 52 | "calorimeter distance (D)" | -- Calorimeter distance (D) -- |
| 20 | 60 | "where $N_s$ is the number" | -- where $N_S$ is the number -- |
| 20 | 61 | "and $N_c$ is the number" | -- and $N_C$ is the number -- |
| 23 | 24 | "Similarly, for arc energy Iarc:" | -- Similarly, for arc energy $I_{arc}$: -- |
| 23 | 45 | "IE($V_N$, $V_{N+1}$)." | -- $IE_{ext}$($V_N$, $V_{N+1}$). -- |
| 26 | 45 | "application, an are current" | -- application, an arc current -- |
| 27 | 40 | "+$B6_{N,M}$ log($I_{arc}$)" | -- +$B6_{N,M}$ log($I_{arc}$). -- |

Signed and Sealed this
Sixteenth Day of August, 2016

Michelle K. Lee

Michelle K. Lee
*Director of the United States Patent and Trademark Office*

| | | | |
|---|---|---|---|
| 27 | 49 | "with dimensionless ratio." | -- with dimensionless ratio -- |
| 28 | 28 | "kA, m) are omitted" | -- kA, mm) are omitted -- |

CLAIMS

| **Column, Line** | **Claim, Line** | **PTO** | **Should Read** |
|---|---|---|---|
| 36, 30 | 2, 3 | "incident energy function has a" | -- incident energy has a -- |
| 37, 12 | 13, 4 | "voltages and further" | -- voltages, and further -- |